(12) United States Patent
Hirakata

(10) Patent No.: US 8,492,972 B2
(45) Date of Patent: Jul. 23, 2013

(54) LIGHT EMITTING ELEMENT, LIGHT EMITTING DEVICE, MANUFACTURING METHOD OF LIGHT EMITTING DEVICE, AND SHEET-LIKE SEALING MATERIAL

(75) Inventor: Yoshiharu Hirakata, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 689 days.

(21) Appl. No.: 11/711,217

(22) Filed: Feb. 27, 2007

(65) Prior Publication Data
US 2008/0018231 A1    Jan. 24, 2008

(30) Foreign Application Priority Data

Mar. 3, 2006    (JP) ................................ 2006-057154

(51) Int. Cl.
*H01J 1/62*    (2006.01)
*H01J 63/04*    (2006.01)

(52) U.S. Cl.
USPC ........... 313/506; 313/498; 313/504; 313/512; 362/311.02; 362/311.03

(58) Field of Classification Search
USPC ................ 313/498–512; 362/311.02, 311.03
See application file for complete search history.

(56) References Cited

U.S. PATENT DOCUMENTS

| | | | |
|---|---|---|---|
| 6,483,562 B1 | 11/2002 | Fukuyoshi et al. |
| 6,720,198 B2 | 4/2004 | Yamagata et al. |
| 6,798,132 B2 | 9/2004 | Satake |
| 6,992,439 B2 | 1/2006 | Yamazaki et al. |
| 7,001,060 B1 | 2/2006 | Kimura |
| 7,264,979 B2 | 9/2007 | Yamagata et al. |
| 7,279,194 B2 | 10/2007 | Hiroki et al. |
| 7,342,256 B2 | 3/2008 | Yamazaki |
| 7,544,972 B2 | 6/2009 | Han et al. |
| 7,579,771 B2 | 8/2009 | Yamazaki et al. |

(Continued)

FOREIGN PATENT DOCUMENTS

| | | |
|---|---|---|
| CN | 1708199 | 12/2005 |
| EP | 1 377 134 A1 | 1/2004 |

(Continued)

OTHER PUBLICATIONS

Search Report re European application No. EP 07003052.3, dated Feb. 13, 2012.

(Continued)

*Primary Examiner* — Nimeshkumar Patel
*Assistant Examiner* — Thomas A Hollweg
(74) *Attorney, Agent, or Firm* — Husch Blackwell LLP

(57) ABSTRACT

A method to improve light extraction efficiency of a light emitting element such as an electroluminescent element is disclosed. Over a substrate, a first electrode, a light emitting layer, and a second electrode are sequentially stacked. The first electrode is a reflective electrode. The second electrode is an electrode which transmits visible light, and light emitted from the light emitting layer is extracted from the second electrode. In contact with a surface of the second electrode, many fine particles are provided. The fine particles have a refractive index which is equal to or higher than that of the second electrode. Light which passes through the second electrode is scattered and refracted by the fine particles. Accordingly, the amount of light which is totally reflected at an interface between the second electrode and a gas is reduced, and light extraction efficiency is improved.

38 Claims, 18 Drawing Sheets

U.S. PATENT DOCUMENTS

| | | | |
|---|---|---|---|
| 7,602,118 B2 | 10/2009 | Cok et al. | |
| 7,619,359 B2 | 11/2009 | Kim | |
| 7,663,305 B2 | 2/2010 | Yamazaki et al. | |
| 7,786,496 B2 | 8/2010 | Yamazaki et al. | |
| 7,791,271 B2 * | 9/2010 | Cok et al. | 313/506 |
| 7,902,087 B2 | 3/2011 | Han et al. | |
| 7,990,058 B2 * | 8/2011 | Cok et al. | 313/506 |
| 8,093,017 B2 | 1/2012 | Pugia | |
| 2001/0005114 A1 | 6/2001 | Jacobsen et al. | |
| 2001/0035713 A1 | 11/2001 | Kimura | |
| 2002/0109458 A1 * | 8/2002 | Pichler et al. | 313/504 |
| 2003/0094691 A1 | 5/2003 | Auch et al. | |
| 2003/0127973 A1 | 7/2003 | Weaver et al. | |
| 2003/0160318 A1 | 8/2003 | Guenther et al. | |
| 2003/0189830 A1 | 10/2003 | Sugimoto et al. | |
| 2004/0119400 A1 | 6/2004 | Takahashi et al. | |
| 2004/0195962 A1 | 10/2004 | Nakamura et al. | |
| 2004/0256601 A1 | 12/2004 | Hubacek et al. | |
| 2005/0064780 A1 | 3/2005 | Auch et al. | |
| 2005/0142379 A1 | 6/2005 | Juni et al. | |
| 2005/0194896 A1 | 9/2005 | Sugita et al. | |
| 2006/0024524 A1 | 2/2006 | Tachikawa | |
| 2006/0043510 A1 | 3/2006 | Yamazaki et al. | |
| 2006/0049745 A1 | 3/2006 | Handa et al. | |
| 2006/0081844 A1 | 4/2006 | Hirosue et al. | |
| 2006/0158109 A1 | 7/2006 | Takahashi et al. | |
| 2006/0186802 A1 * | 8/2006 | Cok et al. | 313/506 |
| 2006/0244371 A1 * | 11/2006 | Cok et al. | 313/506 |
| 2007/0200492 A1 * | 8/2007 | Cok et al. | 313/506 |
| 2007/0205418 A1 | 9/2007 | Takahashi | |
| 2007/0278493 A1 | 12/2007 | Sato | |
| 2007/0290607 A1 | 12/2007 | Okada et al. | |
| 2008/0038303 A1 | 2/2008 | Fishler et al. | |
| 2010/0219429 A1 * | 9/2010 | Cok et al. | 257/89 |
| 2011/0248256 A1 * | 10/2011 | Cok et al. | 257/40 |

FOREIGN PATENT DOCUMENTS

| | | | |
|---|---|---|---|
| EP | 1 603 367 A1 | | 12/2005 |
| EP | 1 605 531 A2 | | 12/2005 |
| EP | 1603367 A1 | * | 12/2005 |
| JP | 11-329742 | | 11/1999 |
| JP | 2004-303724 | | 10/2004 |
| JP | 2005-26057 | | 1/2005 |
| JP | 2005-347274 | | 12/2005 |
| JP | 2006-40741 | | 2/2006 |
| JP | 2006-107744 | | 4/2006 |
| JP | 2008-538155 | | 10/2008 |
| KR | 10-2005-0117254 | | 12/2005 |
| WO | WO 2005/098986 A1 | | 10/2005 |
| WO | WO 2006/006155 A2 | | 1/2006 |
| WO | WO 2006/091614 A1 | | 8/2006 |
| WO | WO 2007/120311 A2 | | 10/2007 |

OTHER PUBLICATIONS

Office Action re Chinese application No. CN 200710087636.4, dated Mar. 2, 2012 (with English translation).

Office Action re Chinese application No. CN 200710087636.4, dated Jul. 4, 2012 (with English translation).

Office Action re Korean application No. KR 2007-0017386, dated Feb. 4, 2013 (with English translation).

* cited by examiner

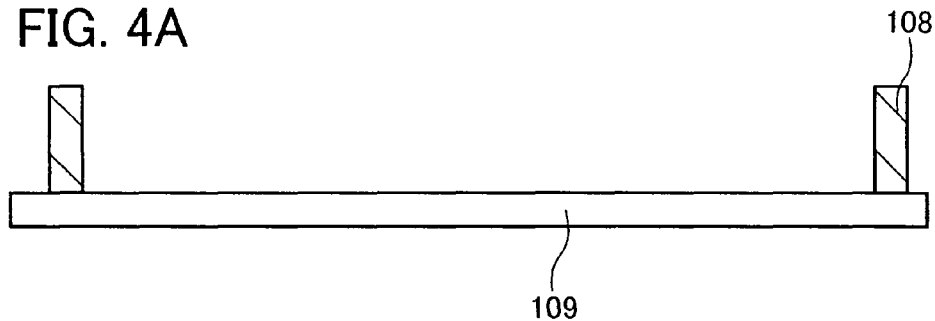
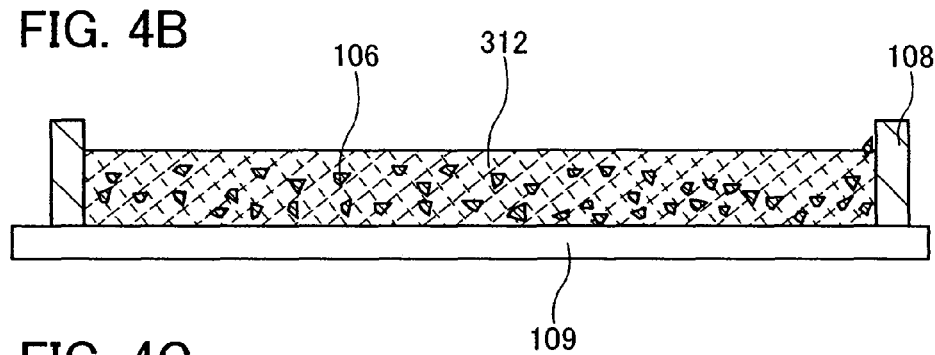
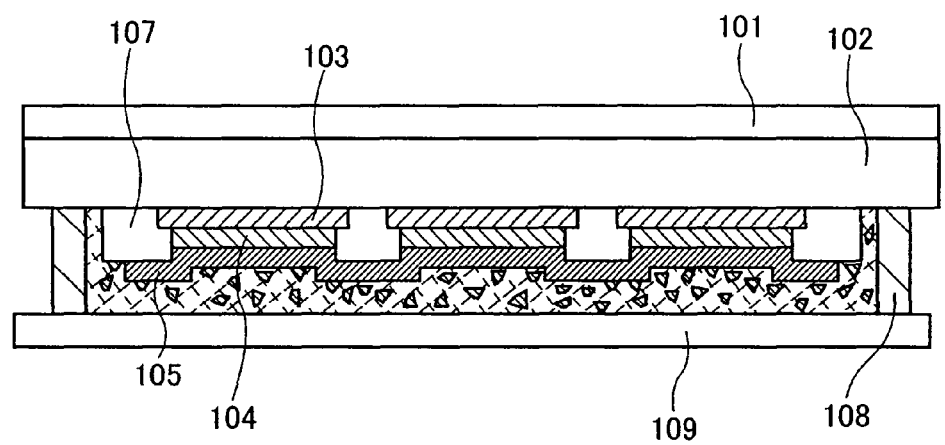
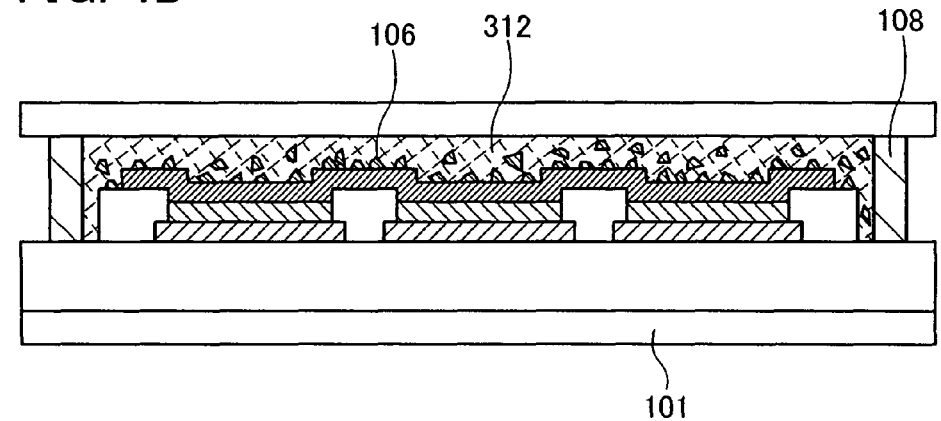

LIGHT EMITTING ELEMENT, LIGHT EMITTING DEVICE, MANUFACTURING METHOD OF LIGHT EMITTING DEVICE, AND SHEET-LIKE SEALING MATERIAL

BACKGROUND OF THE INVENTION

1. Field of the Invention

The present invention relates to a light emitting element and a light emitting device including a light emitting element. In addition, the present invention relates to a method and a material for sealing a light emitting element.

2. Description of the Related Art

Flat panel displays such as liquid crystal panels have been improved, and attempts have been made on improving quality of picture, reducing power consumption, and improving lifetime. In order to utilize the self-emitting ability of electroluminescent elements for practical application of electroluminescent panels (hereinafter referred to as an EL panels) which employs electroluminescent elements (hereinafter referred to as an EL elements) in the pixels, it is desired to realize vivid and bright displays with reduced power consumption. For this purpose, improvement in power efficiency has been investigated by increasing the current-luminance characteristic of materials used in the EL elements. However, there is a limitation on improvement in the power efficiency by the method described above.

The efficiency to extract the light (light extraction efficiency) that is emitted from a light emitting layer of the EL element is only around 20%. The reason of this low light extraction efficiency is that light emitted from the light emitting layer is attenuated since total reflection occurs when the light passes an interface of films having different refractive indexes and that the totally reflected light is absorbed in the EL element. An alternative reason is that the light from the light emitting layer is irradiated through a side surface of the light emitting element, for example, a side surface of a glass substrate.

Reference 1 describes an EL element with improved light extraction efficiency, which was achieved by reducing the amount of total reflection. In Reference 1, by providing a film having dispersed particles over a transparent conductive film to scatter the emitted light, the population of the light, which passes the interface between the transparent conductive film and a low refractive index film, with an incidence angle larger than the critical angle. (Reference 1: Japanese Published Patent Application No. 2004-303724).

The structure of EL panels are classified into a bottom emission structure (lower surface emission structure) and a top emission structure (upper surface emission structure) depending on the direction to which light is extracted. In the bottom emission structure, light is extracted through a substrate over which an EL element is fabricated. In the top emission structure, light is extracted through the upper side of the EL element. Note that the terms "bottom emission structure" and "top emission structure" are often used to refer to the structure of the organic EL panels. However, in this specification, these words are used to classify the structure of a light emitting element or a light emitting device according to not the kind of the light emitting element but the extracting direction of light.

Since the light emission area of the EL element is not strictly limited in the case of the top emission structure compared with the bottom emission structure, the aperture ratio of the active matrix EL panel can be increased by applying the top emission structure. Therefore, in the active matrix EL panels, the top emission structure is advantageous in lowering power consumption and improving quality of the image.

SUMMARY OF THE INVENTION

It is an object of the present invention to improve light extraction efficiency of a light emitting element and to reduce power consumption by decreasing the amount of total reflection of light emitted from a light emitting layer by a means which is different from that described Reference 1.

A light emitting element of the present invention includes a first electrode and a second electrode which face each other and at least a light emitting layer between the first electrode and the second electrode. The first electrode, the light emitting layer, and the second electrode are sequentially stacked, and light emitted from the light emitting layer is extracted from the second electrode.

The first electrode of the abovementioned light emitting element is an electrode which can reflect light emitted from the light emitting layer. Further, the second electrode is an electrode which can transmit light emitted from the light emitting layer.

The light emitting element of the present invention includes at least one light emitting layer between the first electrode and the second electrode. A plurality of light emitting layers may be provided between these electrodes. Further, in the case of fabricating an organic EL element as a light emitting element, for example, in addition to the light emitting layer, a layer such as an electron injecting layer, an electron transporting layer, a hole blocking layer, a hole transporting layer, or a hole injecting layer is appropriately formed. The light emitting element having such a structure is also included in the present invention. In the case of fabricating an inorganic EL element as a light emitting element, an insulating layer can be provided between the light emitting layer and the first electrode and/or between the light emitting layer and the second electrode.

One feature of the light emitting element of the present invention is that a plurality of fine particles is provided in contact with a surface of the second electrode on a light extraction side and that the fine particles have a refractive index which is equal to or higher than that of the second electrode.

When the second electrode is a single layer film, the refractive index of the second electrode means a refractive index of this single layer film. When the second electrode is a multilayer film, the refractive index of the second electrode means a refractive index of a film which is the closest to the light extraction side, namely, a refractive index of a film having a surface on which the fine particles are located.

In the present invention, by providing a plurality of fine particles having a predetermined refractive index, the shape of the surface of the second electrode is changed. That is, the second electrode is an electrode having a plurality of projection portions on its surface. By providing fine particles on the surface, the critical angle of light which passes the surface of the second electrode varies, and light which is totally reflected and cannot be extracted from the conventional EL elements is enabled to pass the second electrode. Accordingly, the amount of total reflection of light which passes through the second electrode decreases, and the light extraction efficiency can be improved.

In order to prevent total reflection at an interface between the fine particles and the second electrode, the fine particles have a refractive index which is equal to or higher than that of the second electrode.

A protective film formed of a transparent conductive film or an insulating film can be provided in contact with the surface of the second electrode on which the fine particles are provided. In order to prevent total reflection at an interface between the protective film and the second electrode, this protective film has an refractive index which is equal to or higher than that of the second electrode.

In another light emitting element of the present invention, a protective film is provided in contact with a surface of a second electrode, and a plurality of fine particles is provided in contact with a surface of the protective film on the light extraction side. Another feature of the light emitting element is that, in order to prevent total reflection at an interface between the protective film and the second electrode, this protective film has a refractive index which is equal to or higher than that of the second electrode, and that the fine particles have a refractive index which is equal to or higher than that of the protective film.

Here, when the protective film is a single layer film, the refractive index of the protective film means a refractive index of this single layer film. When the protective film is a multi-layer film, the refractive index of the protective film means a refractive index of a film which is the closest to the light extraction side, namely, a refractive index of a film on which the fine particles are provided.

In the above-described light emitting element of the present invention, the shape of the surface of the protective film is also changed by providing the fine particles having a predetermined refractive index onto the surface of the protective film on the light extraction side, similarly to the case of providing the fine particles onto the surface of the second electrode. Accordingly, the amount of total reflection of light which passes through the protective film is reduced, and light extraction efficiency of the light emitting element is improved.

When light emitted from a light emitting layer is extracted from a second electrode or a protective film, the amount of light which is totally reflected is reduced by the present invention. Accordingly, light extraction efficiency is improved. The improvement of the light extraction efficiency allows reduction of power consumption of a light emitting element and a light emitting device using the light emitting element. Particularly, the effect of the present invention to reduce the power consumption is more remarkably obtained by employing the top emission structure.

BRIEF DESCRIPTION OF DRAWINGS

In the accompanying drawings:

FIGS. 4A to 4D are cross sectional views of a light emitting device (Embodiment Mode 4);

DETAILED DESCRIPTION OF THE INVENTION

Figure 1:
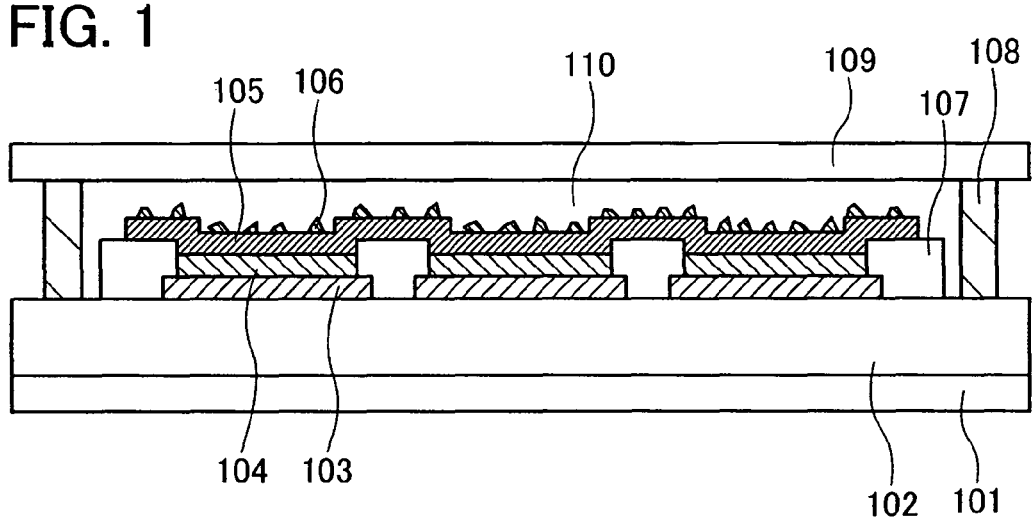
FIG. 1 is a cross sectional view of a light emitting device (Embodiment Mode 1)

Hereinafter, embodiment modes of the present invention will be described with reference to the drawings. Note that the present invention can be carried out in many various modes. It is easily understood by those skilled in the art that various changes may be made in forms and details without departing from the concept and the scope of the present invention. Therefore, the present invention should not be limited to the description of the embodiment modes below.

In addition, it is possible to combine the embodiment modes appropriately without departing from the concept of the present invention. Since the same reference numerals are commonly given to the same components or components having the same function throughout the embodiment modes, the description thereof may be omitted.

Embodiment Mode 1

FIG. 1 is a cross sectional view of a light emitting device in which a light emitting element of this embodiment mode is provided. Over a substrate 101, a support 102 for a light emitting element is provided, and three light emitting elements are provided over the support 102.

In each light emitting element, a first electrode 103, a light emitting layer 104, and a second electrode 105 are sequentially stacked over the substrate 101. A plurality of fine particles 106 is provided on the second electrode 105, in contact with a surface of the second electrode 105. Note that the second electrode 105 is commonly provided for the three light emitting elements. An insulating layer 107 is provided for separating the light emitting elements each other, and is often called a partition wall.

A sealing substrate 109 is fixed to the substrate 101 with a sealing material 108 which is provided to surround a perimeter of the substrate 101, thereby sealing the light emitting elements. In this embodiment mode, an airtight space surrounded by the substrate 101, the sealing material 108, and the substrate 109 is filled with a gas 110. An inert gas such as nitrogen or argon is preferable as the gas 110.

The substrate 101 may be anything as long as it can be a support base of the light emitting elements or the support 102, and a quartz substrate, a semiconductor substrate, a glass substrate, a plastic substrate, a flexible plastic film, or the like can be used. Since a structure where light is extracted from the substrate 101 side is not employed, the substrate 101 is not required to be transparent, and may be colored or opaque.

As the sealing substrate 109, a substrate having a high transmittance to visible light is used in order to extract light from the light emitting elements. For example, a quartz substrate, a glass substrate, a plastic substrate, a flexible plastic film, or the like can be used. A color filter may be provided to the sealing substrate 109 in order to improve color purity of the emitted light or to change an emission color of the light emitting elements. Further, although the substrate 109 having a flat-plate shape is used in this embodiment mode, the shape is not limited to this shape and any shape may be used as long as sealing can be conducted. For example, a substrate having a cap shape like a sealing can is able to be used.

There is a case where the support 102 is not needed. In the case of providing an active matrix type pixel in a light emitting device, the support 102 is a circuit including a transistor, a condenser, or the like for controlling luminance or timing of light emission of each light emitting element.

The first electrode 103 is formed over the support 102. The first electrode 103 has a function of reflecting light which is emitted from the light emitting layer and serves as a cathode. The first electrode is formed of a reflective conductive film including a metal or an alloy. For this metal film, gold (Au), platinum (Pt), nickel (Ni), tungsten (W), chromium (Cr), molybdenum (Mo), iron (Fe), cobalt (Co), copper (Cu), palladium (Pd), aluminum (Al), or the like can be used. For the alloy film, an alloy of magnesium and silver, an alloy of aluminum and lithium, or the like can be used. Such a film for forming the first electrode 103 can be fabricated by a sputtering method, a vapor deposition method, or the like.

As the first electrode 103, a multilayer film in which transparent conductive films are stacked on the metal film or the alloy film, or a multilayer film in which the metal film or the alloy film is sandwiched between two transparent conductive films can also be used. Further, as the first electrode 103, a multilayer film including transparent conductive films having different refractive indices can also be used. Reflectivity can be improved by utilizing multiple interference of light.

After forming the first electrode 103, an insulating layer 107 is formed. The insulating layer 107 is constructed by forming an insulating layer on the surface of the support 102 followed by partly etching the insulating layer to form apertures on which the light emitting layer 104 is fabricated. The insulating layer 107 may be formed by using an organic material including an acrylic resin, a siloxane resin, a polyimide resin, or an epoxy resin; an inorganic material such as a silicon oxide, a silicon oxide containing nitrogen, or a silicon nitride containing oxygen; or a material formed of both inorganic material and the organic material. The organic material film including an acrylic resin or the like is, for example, formed by coating the support 102 with a material solution and baking it. The inorganic material film is formed by a CVD method or a sputtering method.

The light emitting layer 104 is formed by a vapor deposition method or the like over the first electrode 103. The light emitting layer 104 is a layer containing a light emitting substance. A known material can be used for the light emitting layer 104, and either a low molecular material and a high molecular material can be used. Note that as a material for forming the light emitting layer 104, not only an organic compound but also an inorganic compound or an organic compound in which an inorganic compound is mixed can be used. To fabricate the light emitting layer 104, a dry type and/or a wet type film formation methods are selected from, for example, a vapor deposition method using a metal mask, a droplet discharge method without using a metal mask (typically, an inkjet method), a spin coating method, a dip coating method, printing method, and the like, depending on the material of the light emitting layer.

The second electrode 105 is formed over the light emitting layer 104. The second electrode 105 serves as an anode and can transmit the light emitted from the light emitting layer 104. The light generated in the light emitting layer 104 is extracted from the second electrode 105 either directly or after being reflected by the first electrode 103.

The second electrode 105 is typically a transparent conductive film. In particular, in the case where the light emitting element is an organic EL element, a conductive film formed in the following manner can be used: for adjusting work function, a material having a low transmittance to visible light such as a metal is extremely thinly formed on the first electrode 103 side with a thickness of 1 nm to 50 nm, preferably about 5 nm to 20 nm, and a transparent conductive film is stacked thereon. In this case, for the thin film formed extremely thinly, gold (Au), platinum (Pt), nickel (Ni), tungsten (W), chromium (Cr), molybdenum (Mo), iron (Fe), cobalt (Co), copper (Cu), palladium (Pd), or the like can be used. Such a thin film can be formed by, for example, a sputtering method, a droplet discharge method, or the like.

The materials of the transparent conductive films used for the second electrode 105 are materials having a high transmittance to light in a visible light range (400 to 800 nm), and typically metal oxides. For example, an oxide of an element selected from zinc (Zn), indium (In), and tin (Sn) or a compound in which a dopant is added to these oxides can be given. As a dopant for zinc oxide, Al, Ga, B, In, Si, or the like or an oxide of these elements is used. Note that zinc oxides containing these dopants are called AZO, GZO, BZO, and IZO respectively. As a dopant of indium oxide, Sn, Ti, or the like is used. Indium oxide doped with Sn is called ITO (Indium Tin Oxide). As a dopant of a tin oxide, Sb, F, or the like is used. Further, for each transparent conductive film, a compound in which two kinds of oxides selected from the above-described zinc oxide, indium oxide, tin oxide, and oxides thereof containing dopants are mixed can be used.

Next, the fine particles 106 are sprayed on the surface of the second electrode 105 by a dry method or a wet method in the same manner for spraying spacer of a liquid crystal panel. A dry method is a method in which the fine particles 106 are freely fallen by the action of airflow or static electricity. A wet method is a method in which a mixture of the fine particles 106 and a solvent is sprayed. In the case of spraying the mixture containing fine particles 106 by the wet method, the solvent is evaporated by heating (100° C. or less) in an extent that the light emitting layer 104 is not affected unless a solvent is volatilized before the fine particles 106 reaches the substrate 101 after spraying the mixture containing fine particles 106.

As another method of providing the fine particles 106 on the surface of the second electrode 105, a method can also be used in which a mixture of the fine particle 106 and a volatile solvent such as alcohol is applied to the surface of the second electrode 105 and then the solvent is volatilized. As the application method, a cast method, a spin coating method, a spray method, an inkjet method, a printing method, a dropping method, or the like can be used.

A solvent for a mixture in which fine particles are mixed is selected from water, alcohols such as ethanol or isopropanol (IPA), and the like, depending on the material of the fine particles 106.

Each fine particle 106 is formed of a material having a refractive index which is equal to or higher than that of the second electrode 105. In this embodiment mode, the refractive index of the second electrode 105 is a refractive index of the transparent conductive film used for the second electrode 105.

In order to seal the light emitting elements, the substrate 109 on the perimeter of which the uncured sealing material 108 is provided is prepared. The uncured sealing material 108 is provided with a predetermined shape on the perimeter of the substrate 109 by a printing method, a dispensing method, or the like. The sealing material 108 can also be provided on the substrate 101 side after spraying the fine particles 106 onto the second electrode 105.

For the sealing material 108, a resin curable by UV light or the like such as an epoxy resin or an acryl resin, or a heat-curable resin can be used. Since the material of the light emitting layer 104 readily decomposes upon heating, a light-curable resin is optimal for the sealing material 108. If a heat-curable resin is used, it is preferable that the curing temperature is 100° C. or less.

The substrate 109 is provided over the substrate 101 over which the fine particles 106 are sprayed. While pressure is applied to the substrate 101 and the substrate 109, the uncured sealing material 108 is irradiated with UV light to cure the resign, and the substrate 101 and the substrate 109 are firmly attached. It is obvious that when the heat-curable resin is used as the sealing material 108, heat treatment is conducted. In addition, it is desirable that an ambient pressure is somewhat reduced from atmospheric pressure in the period after providing the substrate 109 over the substrate 101 and before curing the sealing material 108. Note that the atmosphere desirably contains as little moisture as possible, and for example, a nitrogen atmosphere can be adopted.

By curing the sealing material 108, the space between the substrate 101 and the substrate 109 is air-sealed and filled with the gas 110.

After sealing the substrate 101 with the substrate 109, the light emitting device is divided into arbitrary size.

One feature of this embodiment mode is that the shape of the surface of the second electrode 105 is changed by providing the plurality of fine particles 106 on the surface of the second electrode 105 on the light extraction side. Due to the plurality of fine particles 106, the surface of the second electrode 105 has a plurality of projections, and a critical angle of light entering an interface between the second electrode 105 and the gas 110 varies depending on places. In other words, light having an incident angle which normally reflects completely is not totally reflected in the case of the present device, and the light is refracted and scattered by the fine particles 106 so that the light can pass the second electrode 105. Thus, by providing the fine particles 106 in contact with the surface of the second electrode 105, the amount of light which is totally reflected at the interface between the second electrode 105 and the gas 110 is reduced. Accordingly, light extraction efficiency is improved.

Note that in Reference 1, it is described that light extraction efficiency is improved by providing a particle-containing transparent electrode layer 3', in which fine particles are dispersed, over a transparent electrode layer 3 (see FIG. 2 and the description thereof). Specifically, Reference 1 describes that extraction efficiency is improved by the change in an angle of light to an angle which does not cause total reflection, which is achieved by scattering the light with the fine particles in the particle-containing transparent electrode layer 3'. In Reference 1, it is not described that the conditions of total reflection (critical angle) of light which is extracted from the transparent electrode layer 3 are changed. On the other hand, the invention proposed in this specification is that the total reflection condition of the interface itself between the second electrode 105 and the gas 110 is changed by changing the shape of the interface in order to improve light extraction efficiency. Therefore, the essential principle of the invention proposed in this specification is completely different from that described in Reference 1.

As the material of the fine particles 106, either an organic material or an inorganic material may be used. The oxide or the oxide including a dopant, which are described as the transparent conductive film material of the above-described second electrode 105, such as tin oxide ($SnO_2$), zinc oxide (ZnO), or ITO; or a metal oxide such as strontium oxide ($Sr_3O_2$), aluminum oxide ($Al_2O_3$), titanium oxide ($TiO_2$), yttrium oxide ($Y_2O_3$), or cerium oxide ($CeO_2$, $Ce_2O_3$) can be given as the material. Further, various ferroelectric materials can also be used. For example, an oxide-based ferroelectric material such as barium titanate ($BaTiO_3$), $KNbO_3$ or $LiNbO_3$ is exemplified. Further, an inorganic material such as silicon oxide, silicon nitride, silicon nitride oxide ($SiN_xO_y$, $0<x<4/3$, $0<y<2$, $0<3x+2y\leq4$), zirconium, DLC (diamond like carbon), or carbon nanotube can be used.

The size (particle diameter) of the fine particles 106 is necessarily the size with which the above-described effect can be obtained, and is 2 nm or more and preferably 20 nm or more. Further, it is preferable that the size of the fine particles 106 does not exceed the wavelength of the visible light range, and the upper limit of the size is 800 nm. In consideration of optical design of a light emitting element, the upper limit of the size is preferably 100 nm.

The shape of each fine particle 106 is preferably the shape with which light is effectively concentrated or scattered. The shape is, for example, a columnar shape, a polyhedral shape, a polypyramidal shape such as a triangular pyramid, a circular cone shape, a concave lens shape, a convex lens shape, a hog-backed shape, a prism shape, a spherical shape, a semi-spherical shape, or the like.

Many fine particles 106 are provided on the surface of the second electrode 105. At this time, it is not necessary that all the fine particles 106 have the same material, the same size, and the same shape, and each of them may have different materials, sizes, or shapes.

The structure of a light emitting element of the present invention is not limited to the one shown in FIG. 1 or the like as long as at least one light emitting layer exists between two electrodes. Light emitting elements utilizing electroluminescence are classified depending on whether a light emitting material included in its light emitting layer is an organic compound or an inorganic compound; generally, the former is called an organic EL element, and the latter is called an inorganic EL element.

In the case where a light emitting element is an organic EL element, in addition to the light emitting layer, a functional layer such as an electron injecting layer, an electron transporting layer, a hole blocking layer, a hole transporting layer, or a hole injecting layer may be freely combined. In addition, a plurality of light emitting layers may be provided between the electrodes.

An inorganic EL element can also be formed as a light emitting element. Inorganic EL elements are classified into a dispersion type inorganic EL element and a thin-film type inorganic EL element depending on its device structure. The former has a light emitting layer in which particles of a light emitting material are dispersed in a binder, whereas the latter has a light emitting layer made of a thin film of a light emitting material. Although they have such a difference therebetween, they have a common feature that electrons accelerated by high electric field are required. Two light-emission mechanisms are accepted. One is the donor-acceptor recombination mechanism, in which a donor level and an acceptor level are utilizes. The other is a localized light emission mechanism which utilizes inner-shell electron transition of metal ions. In general, the dispersion-type inorganic EL element performs the donor-acceptor recombination light emission mechanism, and the thin-film type inorganic EL element performs the localized light emission mechanism.

The inorganic EL element emits light by applying voltage between a pair of electrode layers which interpose a light emitting layer therebetween, and can be operated in either DC driving or AC driving.

Embodiment Mode 2

Embodiment Mode 2 will be described with reference to FIGS. 2A to 2D. The air-sealed space between the substrate 101 and the substrate 109 is filled with a gas in Embodiment Mode 1. However, in a light emitting device of this embodiment mode, the space is filled with a solid material which is prepared by filling a liquid-phase material and curing it. A sealing structure of a light emitting device in which a solid is provided between substrates is called a solid sealing structure, and this word is frequently used to distinguish it from the structure in which a gas is filled. In this specification, this word will be used to distinguish the structure in which a solid is provided between substrates from the structure in which a gas is filled.

Figure 2A:
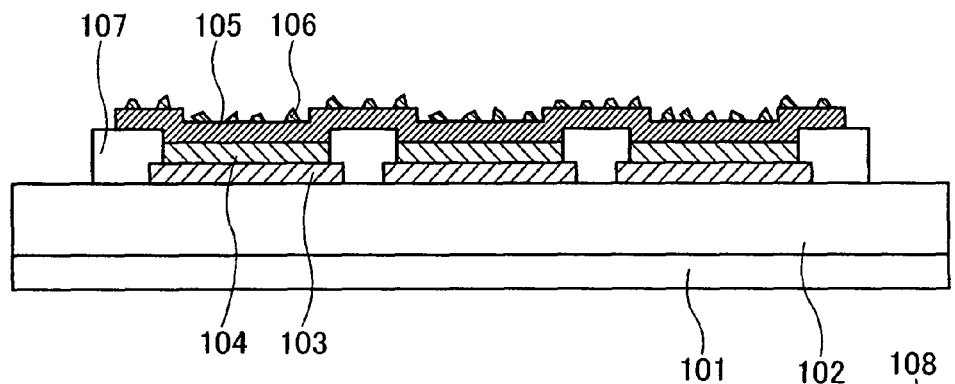
FIGS. 2A to 2D are cross sectional views of a light emitting device (Embodiment Mode 2)

By applying the process described in Embodiment Mode 1, a substrate 101 over which fine particles 106 are sprayed on a surface of a second electrode 105 is prepared (FIG. 2A).

Figure 2B:
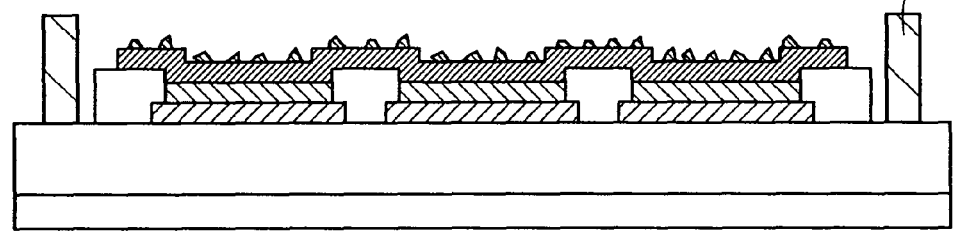

Next, an uncured sealing material 108 is provided with a predetermined shape on a perimeter of the substrate 101 by a printing method, a dispensing method, or the like in a similar manner to Embodiment Mode 1 (FIG. 2B).

Figure 2C:
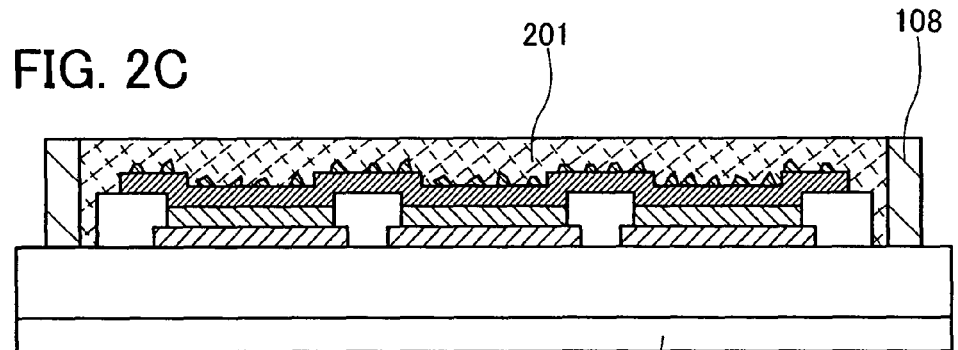

In this embodiment mode, a filler 201 is provided in a space between the substrate 101 and a substrate 109, which is air-sealed with the sealing material 108. As a material of the filler 201, a UV light curable resin such as an epoxy resin or an acryl resin, a visible light curable resin, or a heat-curable resin can be used. When a material of a light emitting layer 104 is an organic material, in consideration of the poor heat resistance ability of the organic material, the UV light curable resin or a visible light curable resin is preferable. In the case of using a heat-curable resin, a resin having a curing temperature of 100° C. or less is selected. After providing the sealing material 108, the uncured (liquid-phase) filler 201 is dropped into a region surrounded by the sealing material 108 (FIG. 2C).

Figure 2D:
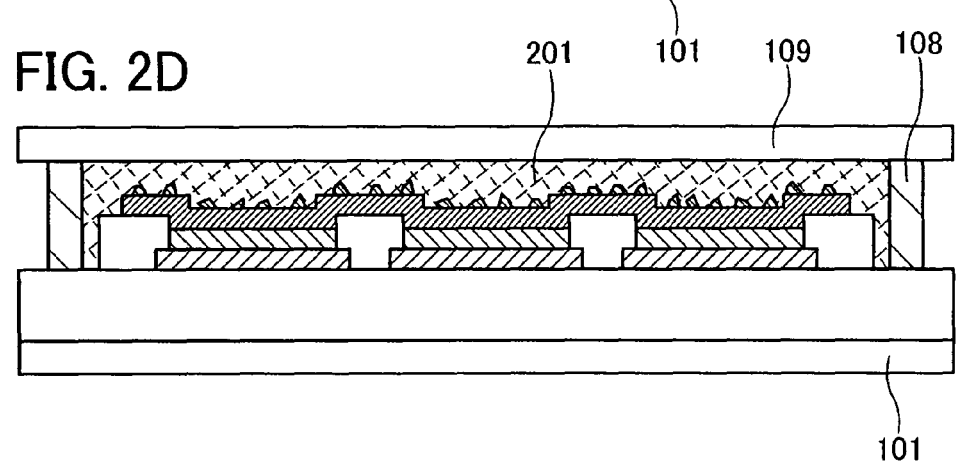

Next, the substrate 109 is provided over the substrate 101 over which the uncured sealing material 108 and the filler 201 are prepared. While applying pressure to the substrate 101 and the substrate 109, the uncured sealing material 108 and the filler 201 are irradiated with light or heated so as to be cured, and the substrate 109 and the substrate 101 are firmly attached. The cured filler 201 is provided in contact with a surface of the second substrate and the surface of the second electrode 105 and fixes the substrate 109 to the substrate 101. Further, the fine particles 106 are fixed on the surface of the second electrode 105 by the filler 201. After curing the sealing material 108 and the filler 201, the device is divided into arbitrary size (FIG. 2D).

Embodiment Mode 3

Figure 3A:
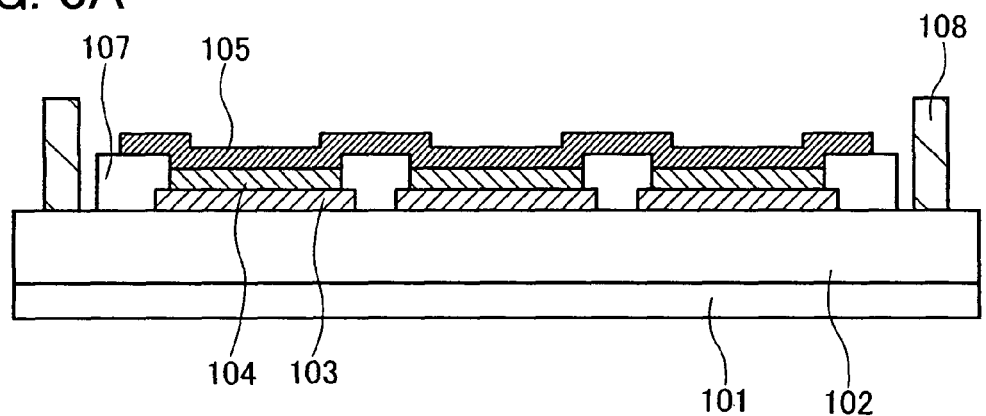
FIGS. 3A to 3C are cross sectional views of a light emitting device (Embodiment Mode 3)
Figure 3B:
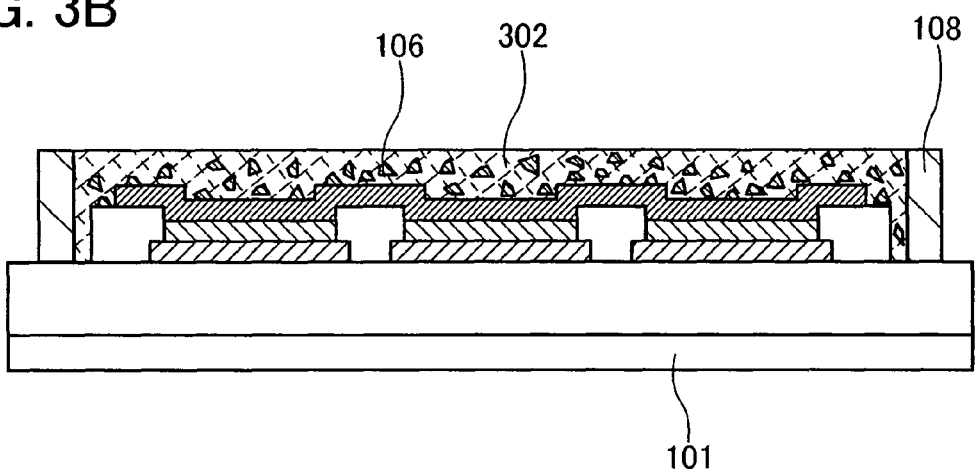
Figure 3C:
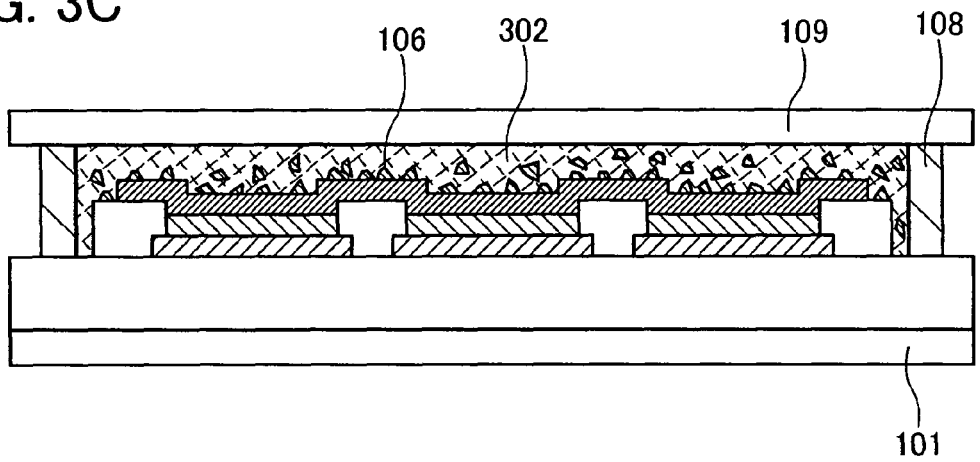

Embodiment Mode 3 will be described with reference to FIGS. 3A to 3C. This embodiment mode will also describe a light emitting device having a solid sealing structure similar to Embodiment Mode 2.

By the process described in Embodiment Mode 1, a substrate 101 over which light emitting elements each including a first electrode 103, a light emitting layer 104, and a second electrode 105 are formed over a support 102 is prepared. In addition, before spraying fine particles, a sealing material 108 is provided on a perimeter of the substrate 101 as described in Embodiment Mode 1 (FIG. 3A).

An uncured (liquid-phase) filler 302 in which fine particles 106 are dispersed is prepared. As a material of the filler 302, similar materials to those of the filler 201 of Embodiment Mode 2 can be used. In a region surrounded by the sealing material 108, the uncured filler 302 in which the fine particles 106 are dispersed is dropwised (FIG. 3B).

The substrate 109 is provided over the substrate 101. Then, the substrate 101 is left at rest so that as many fine particles 106 as possible in the filler 302 are in contact with a surface of the second electrode 105. Then, while applying pressure to the substrate 101 and the substrate 109, the sealing material 108 and the filler 302 are cured by irradiating UV light or heating to give a light emitting device having a solid sealing structure (FIG. 3C).

In this embodiment mode, in order to provide the fine particles 106 on the surface of the second electrode 105, the fine particles 106 are dispersed in the material of the filler 302, and the filler 302 is dropwised on the surface of the second electrode 105. In a light emitting device of this embodiment mode, the fine particles 106 are also dispersed in the filler 302, which distinguishes this embodiment mode from the Embodiment Mode 2.

Embodiment Mode 4

Embodiment Mode 4 will be described with reference to FIGS. 4A to 4D. This embodiment mode will describe a light emitting device having a solid sealing structure. In Embodiment Mode 3, the filler in which the fine particles are dispersed is dropwised on the substrate side where the light emitting elements are provided. On the other hand, this embodiment mode will describe an example in which the filler is dropwised onto another substrate for sealing.

A sealing material 108 is provided with a predetermined shape on a perimeter of a substrate 109 by a printing method, a dispensing method, or the like (FIG. 4A).

An uncured (liquid-phase) filler 312 in which fine particles 106 are dispersed is prepared. A material of the filler 312 is similar to that of the filler 201 of Embodiment Mode 2. Into a region surrounded by the sealing material 108, the uncured filler 312 in which the fine particles 106 are dispersed is dropwised (FIG. 4B).

By the process described in Embodiment Mode 1, a substrate 101 over which light emitting elements each including a first electrode 103, a light emitting layer 104, and a second electrode 105 are formed over a support 102 is prepared. The substrate 101 is provided over the substrate 109 (FIG. 4C).

After providing the substrate 101 over the substrate 109, the top and bottom sides are reversed so that the substrate 101 is set below the substrate 109. Then, the substrate 101 is left at rest so that the fine particles 106 in the filler 312 are precipitated. Then, while applying pressure to the substrate 101 and the substrate 109, the sealing material 108 and the filler 312 are cured by irradiating UV light or heating to give a light emitting device having a solid sealing structure (FIG. 4D).

Note that, as described in Embodiment Modes 2-4, in the solid sealing structure in which the sealing material is provided on the perimeter, the cured filler need not necessarily fill the entire space which is surrounded by the sealing material, as long as the cured filler covers at least the region provided with the light emitting elements (the region provided with the light emitting layer 104 or the second electrode 105) over the substrate 101.

Embodiment Mode 5

Embodiment Mode 5 will be described with reference to FIGS. 5A to 5C. This embodiment mode will describe a light emitting device having a solid sealing structure. Embodiment Modes 2-4 describe the solid sealing structure in which a solid, prepared by curing a liquid-phase material, is provided. This embodiment mode will describe a solid sealing structure using a solid which is formed by curing a sheet-like (film-like) sealing material provided over a film base.

Figure 5A:
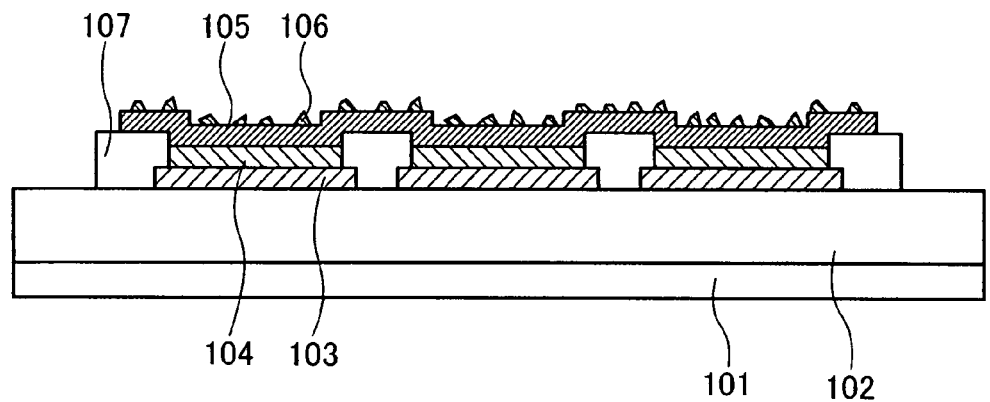
FIGS. 5A to 5C are cross sectional views of a light emitting device (Embodiment Mode 5)

As described in Embodiment Mode 1, a substrate 101 over which fine particles 106 are sprayed on a surface of a second electrode 105 is prepared (FIG. 5A).

In order to firmly attach a substrate 109 to the substrate 101, a sheet-like sealing material 501 is prepared. The uncured sheet-like sealing material 501 is a sheet-like sealing material formed of a resin material having an adhesive function. A UV light curable resin, a visible light curable resin, or a heat-curable resin can be used as the resin material. In order to protect adhesive surfaces, each of the surfaces is covered with a film base 502. The film base 502 on one surface of the sealing material 501 is peeled, and this surface is placed over the surface of the substrate 101 (FIG. 5B).

The film base on the other surface is next peeled off. Then, the substrate 109 is placed over the substrate 101. While applying pressure to the substrate 101 and the substrate 109, the sheet-like sealing material 501 is cured by irradiating UV light or heating, and the substrate 109 is firmly fixed to the substrate 101. Furthermore, the fine particles 106 are firmly fixed on the second electrode 105 by the cured sealing material 501 (FIG. 5C).

By using the sheet-like sealing material 501 in this manner, effects such as firmly fixing the substrate 109 to the substrate 101, forming a light emitting device having a solid sealing structure, and fixing the fine particles 106 can be obtained.

Figure 5B:
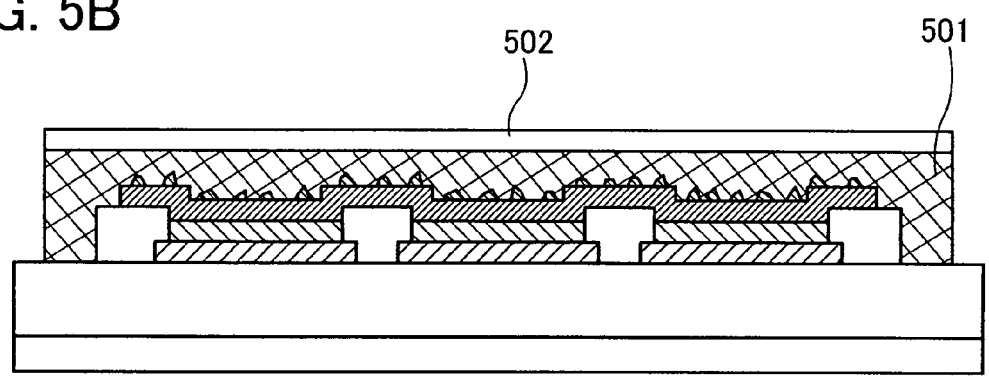
Figure 5C:
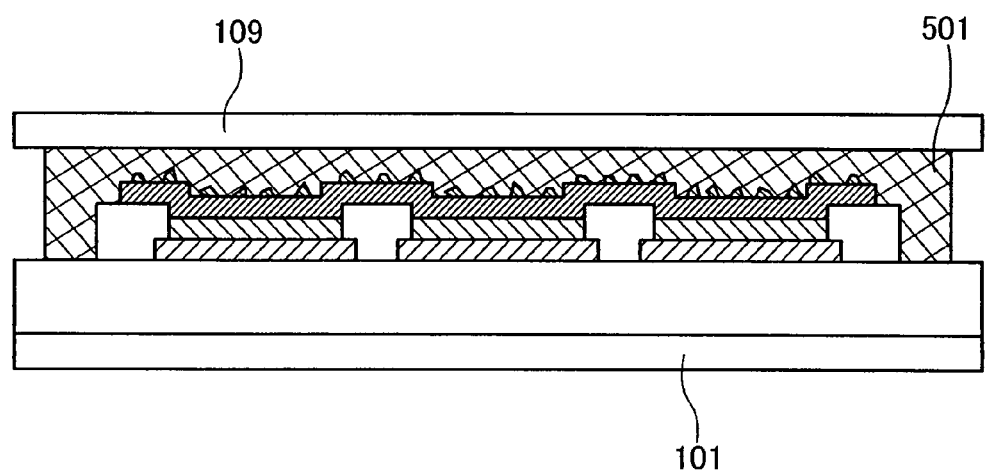

In the step shown in FIG. 5B, the sheet-like sealing material 501 can be provided not over the substrate 101 but on the sealing substrate 109 side as well. In this case, instead of spraying the fine particles 106 on the surface of the second electrode, the fine particles 106 can be sprayed on the surface of the sealing material 501 provided on the substrate 109.

Embodiment Mode 6

Embodiment Mode 6 will be described with reference to FIGS. 6A to 6D. Similarly to Embodiment Mode 5, this embodiment mode will describe a light emitting device having a solid sealing structure which uses a sheet-like sealing material.

Figure 6A:
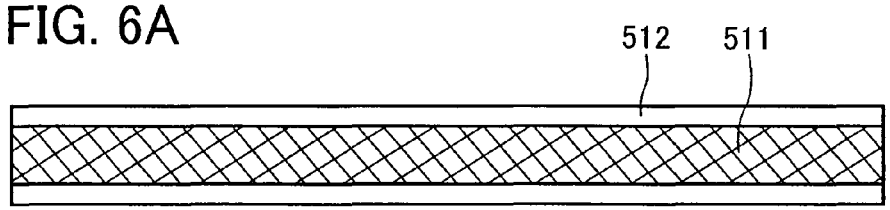
FIGS. 6A to 6D are cross sectional views of a light emitting device (Embodiment Mode 6)

An uncured sheet-like sealing material 511 is prepared. The uncured sheet-like sealing material 511 is formed of a resin layer having an adhesive function and each of surfaces of the sealing material 511 is covered with a film base 512. As the resin layer forming the sheet-like sealing material 511, a UV light curable resin, a visible light curable resin, or a heat-curable resin is used (FIG. 6A).

Figure 6B:
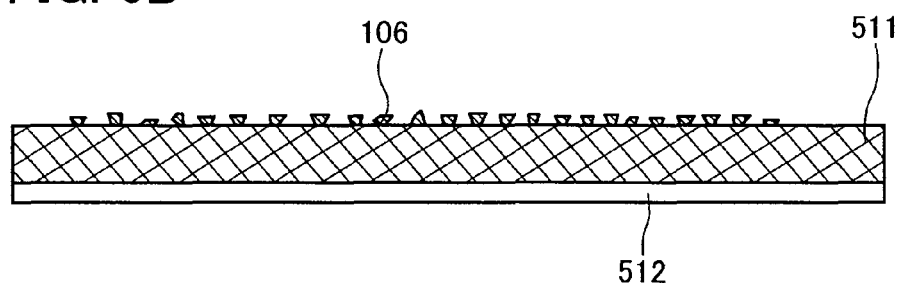

The film base 512 on one surface of the sealing material 511 is peeled off, and fine particles 106 are provided on the surface. The fine particles 106 are provided on the one surface of the sealing material 511 by using a dry-type or a wet type spray method as described in Embodiment Mode 1 or a printing method such as a gravure printing method, so that the sheet-like sealing material 511 to which the fine particles 106 are attached is prepared (FIG. 6B).

Figure 6C:
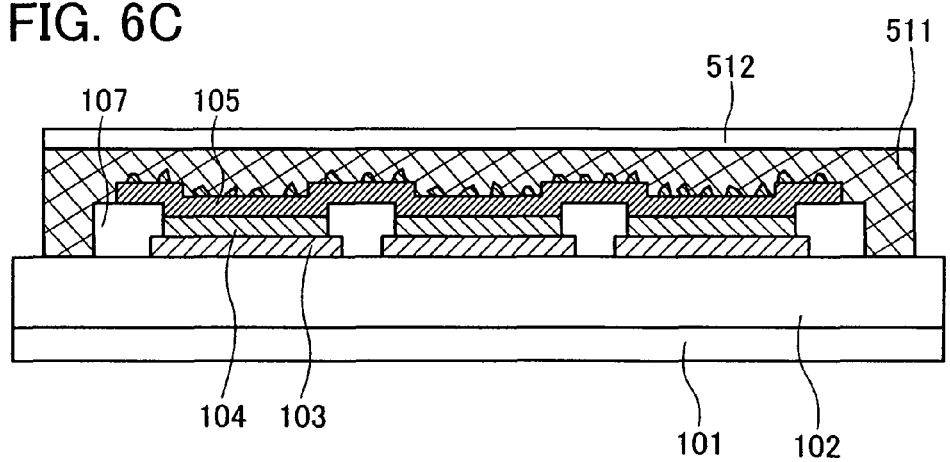

As described in Embodiment Mode 1, a substrate 101 over which light emitting elements are formed is prepared. Over a surface of this substrate 101, the sheet-like sealing material 511 to which the fine particles 106 are attached is placed. At this time, a surface of the sealing material 511 on which the fine particles 106 are provided is made to be in contact with a second electrode 105 (FIG. 6C).

Figure 6D:
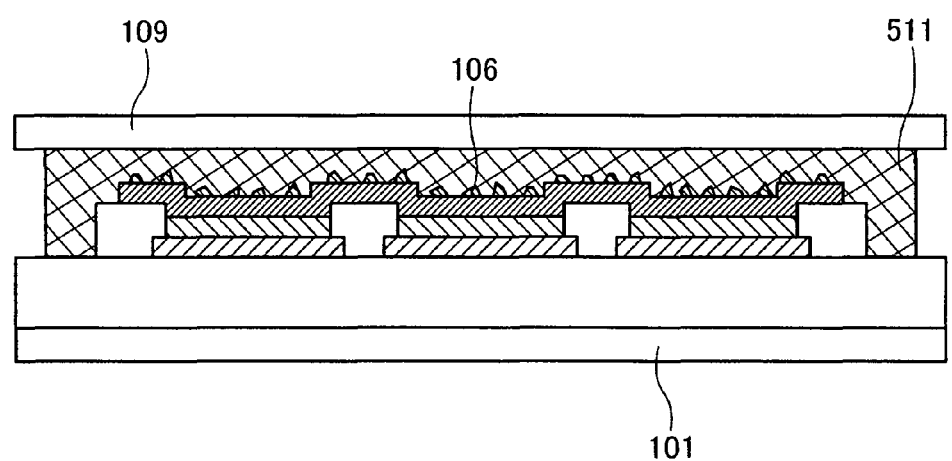

The other film base 512 is peeled from the sealing material 511, and a substrate 109 is placed over the surface. While applying pressure to the substrate 101 and the substrate 109, the sheet-like sealing material 511 is cured by UV light irradiation or heating, and the substrate 109 is firmly fixed to the substrate 101 (FIG. 6D).

The substrate 109 can be placed over the substrate 101 as well after providing the sealing material 511 having the fine particles 106 over a surface of the substrate 109. At this time, the surface of the sealing material 511, to which the fine particles 106 are not sprayed, is put on the substrate 109 side.

The sheet-like sealing material 511 having the fine particles 106 shown in FIG. 6B has an effect improving light extraction efficiency of light emitting elements, as well as effects such as firmly fixing the substrate 109 to the substrate 101, forming a light emitting device having a solid sealing structure, and fixing the fine particles 106. Thus, a sheet-like sealing material having fine particles is very useful as a component of a light emitting device in which light generated from a light emitting element is extracted from the top side of the light emitting element.

In the case where a light emitting device having a solid sealing structure is formed using a sheet-like sealing material as shown in Embodiment Modes 5 and 6, the sheet-like sealing material need not necessarily cover the entire surface of the substrate 101 or the substrate 109. It is acceptable as long as the sheet-like sealing material covers at least a region in which light emitting elements are provided over the substrate 101 (region in which a light emitting layer 104 or the second electrode 105 is provided).

Embodiment Mode 7

Figure 7:
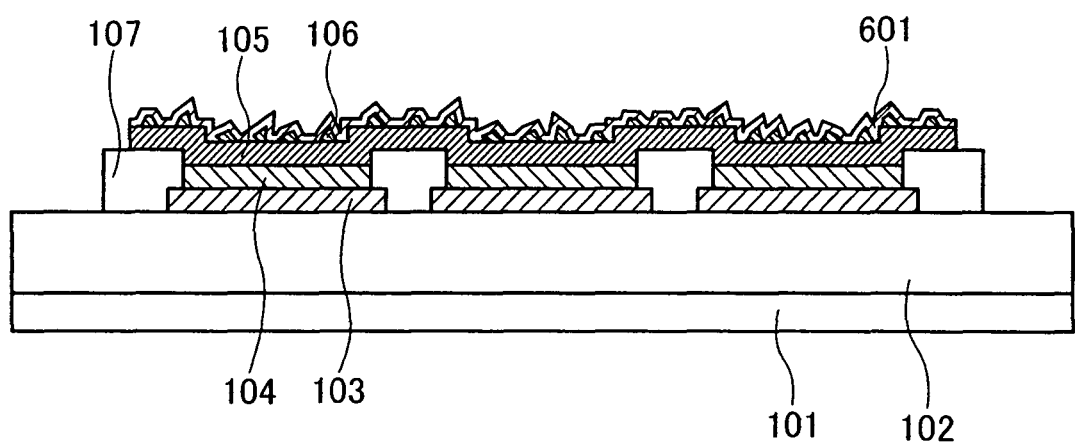
FIG. 7 is a cross sectional view of a light emitting device (Embodiment Mode 7)
Figure 8A:
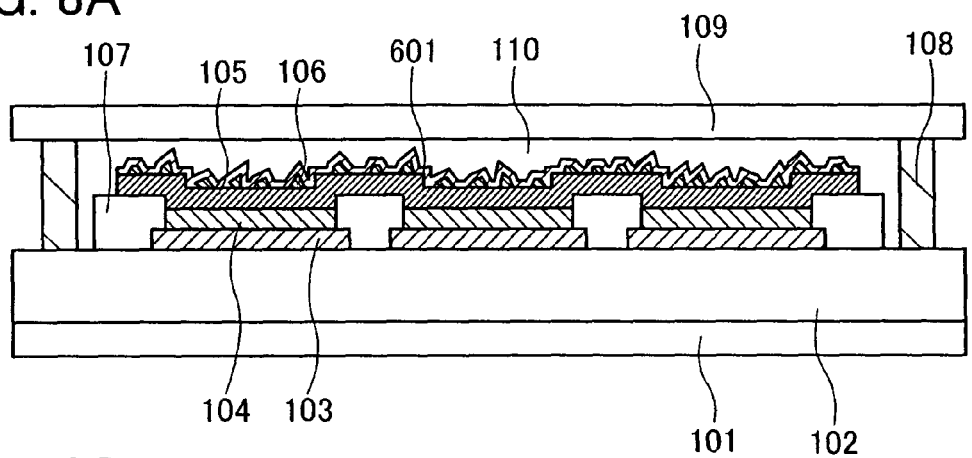
FIGS. 8A to 8C are cross sectional views of a light emitting device (Embodiment Mode 7)
Figure 8B:
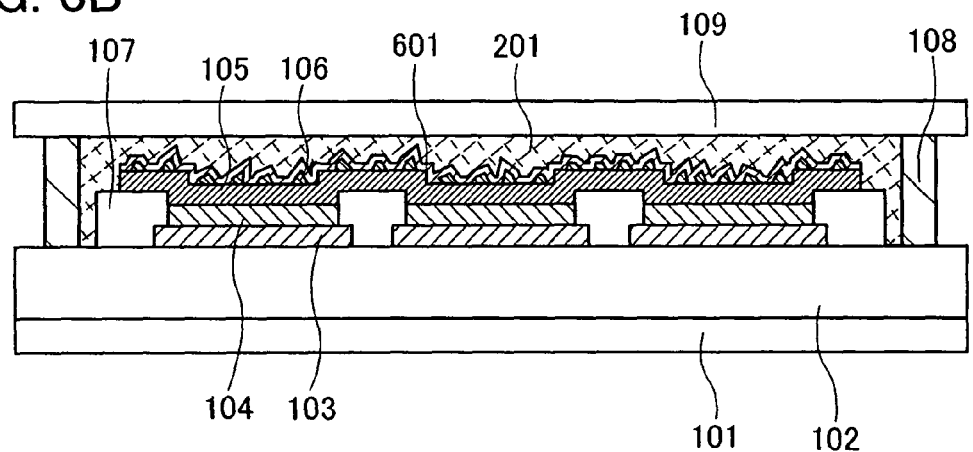
Figure 8C:
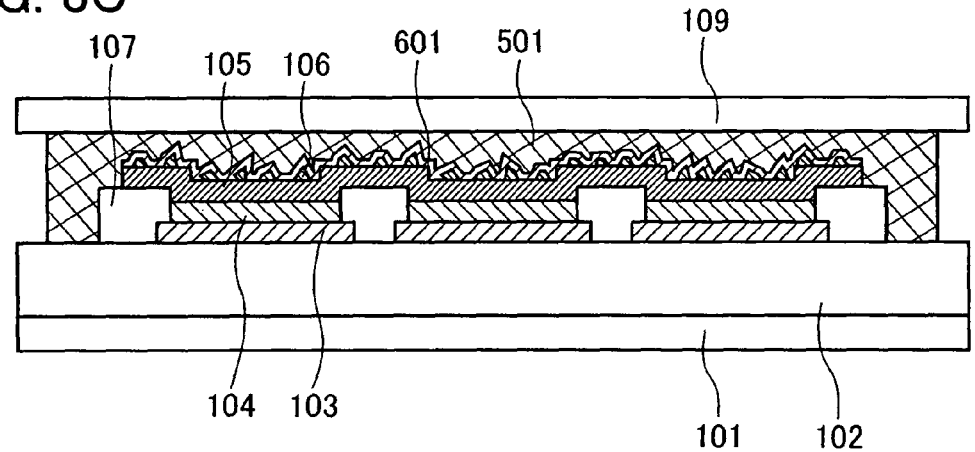

Embodiment Mode 7 will be described with reference to FIGS. 7 to 8C. This embodiment mode will demonstrates a light emitting device including light emitting elements in which fine particles are interposed between a second electrode and a transparent conductive film.

As described in Embodiment Mode 1, a substrate 101 over which fine particles 106 are sprayed on a surface of a second electrode 105 is prepared.

The surface of the second electrode 105, where the fine particles 106 are provided, is formed of a transparent conductive film. Over this transparent conductive film, a protective film 601 is formed. Accordingly, the structure is obtained, where the fine particles 106 are sandwiched between the transparent conductive film which covers the surface of the second electrode 105 and the protective film 601. Thus, compared with the structure which does not include the protective film 601, the fine particles 106 are more tightly fixed to the surface of the second electrode (FIG. 7).

As a material of the protective film 601, one can select a material having a refractive index which is equal to or higher than that of the transparent conductive film that covers the surface of the second electrode 105. This is for suppressing total reflection at an interface between the second electrode 105 and the protective film 601. Specifically, the material of the protective film 601 can be selected from the materials employed for the transparent conductive film described in Embodiment Mode 1.

For example, the transparent conductive film described in Embodiment Mode 1 is formed by the protective film 601. Such a transparent conductive film can be formed by a sputtering method or a vapor deposition method.

Further, for the protective film 601, as well as the transparent conductive film, silicon oxide ($SiO_y$, $0<y\leqq2$), silicon nitride ($SiN_x$, $0<x\leqq4/3$), silicon nitride oxide ($SiN_xO_y$, $0<x<4/3$, $0<y<2$, $0<3x+2y\leqq4$), DLC, aluminum nitride, or the like can be used. Such a film can be formed by a CVD method, a sputtering method, or a vapor deposition method. In the case of forming silicon oxide, silicon nitride, silicon nitride oxide, or the like by a plasma CVD method for example, adjustment of the refractive index of the protective film 601 can be performed by adjusting the relative permittivity of a stacked film, which is achieved by changing ratio of source gases, kind of source gases, or processing temperature.

Optical design of a light emitting device is readily performed by arranging the refractive index of the second electrode 105 to be equal to that of the protective film 601, which is realized by using the same transparent conductive film as the surface of the second electrode 105 for the protective film 601. The use of a silicon nitride film having a lower moisture-permeability than that of the transparent conductive film or a silicon nitride oxide film having a lower moisture-permeability than that of the transparent conductive film is advantageous in suppressing deterioration of a light emitting element caused by moisture. Note that the silicon nitride oxide film has a higher proportion of nitrogen than that of oxygen.

When the refractive index of the protective film 601 is equal to that of the second electrode, projections and depressions are also made on a surface of the protective film 601 by utilizing the fine particles 106 in order to suppress total reflection of light which passes the protective film 601. For example, the size of the fine particles 106 is increased to achieve this purpose. In the case where the refractive index of the protective film 601 is higher than that of the second electrode 105, the projections and depressions made by the fine particles 106 on the surface of the protective film 601 are not necessarily formed prominently.

Sealing of the light emitting elements is conducted by fixing the substrate 109 to the substrate 101 as described in Embodiment Modes 1, 2, and 5. Light emitting devices on which the sealing processes of Embodiment Modes 1, 2, and 5 are conducted are shown in FIGS. 8A to 8C. FIG. 8A corresponds to Embodiment Mode 1, FIG. 8B corresponds to Embodiment Mode 2, and FIG. 8C corresponds to Embodiment Mode 5.

Embodiment Mode 8

Figure 9:
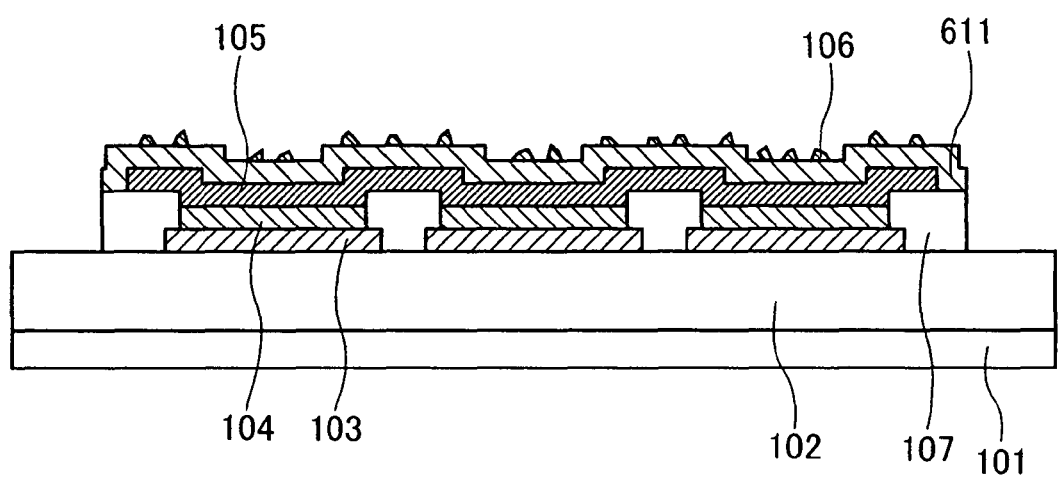
FIG. 9 is a cross sectional view of a light emitting device (Embodiment Mode 8)
Figure 10A:
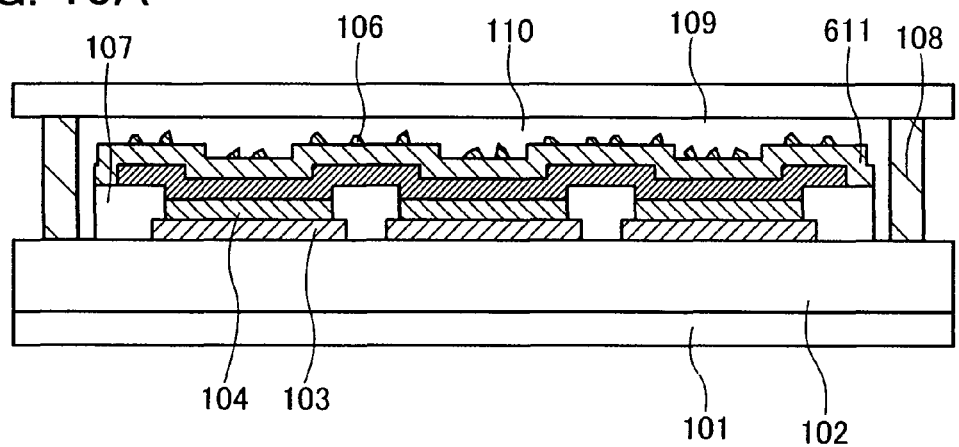
FIGS. 10A to 10C are cross sectional views of light emitting devices (Embodiment Mode 8)
Figure 10B:
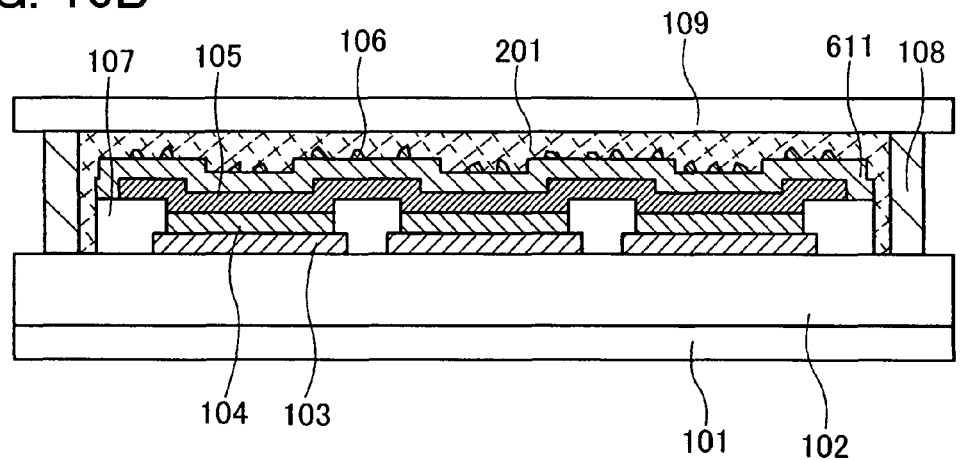
Figure 10C:
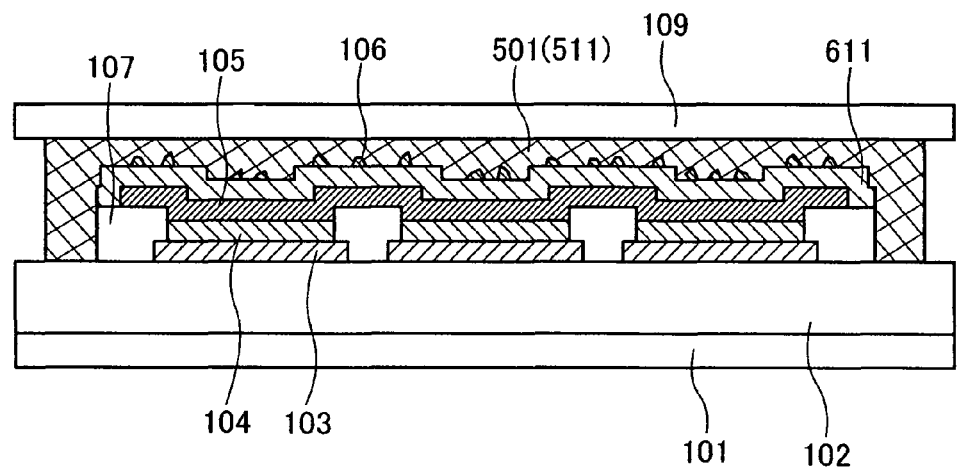
Figure 11:
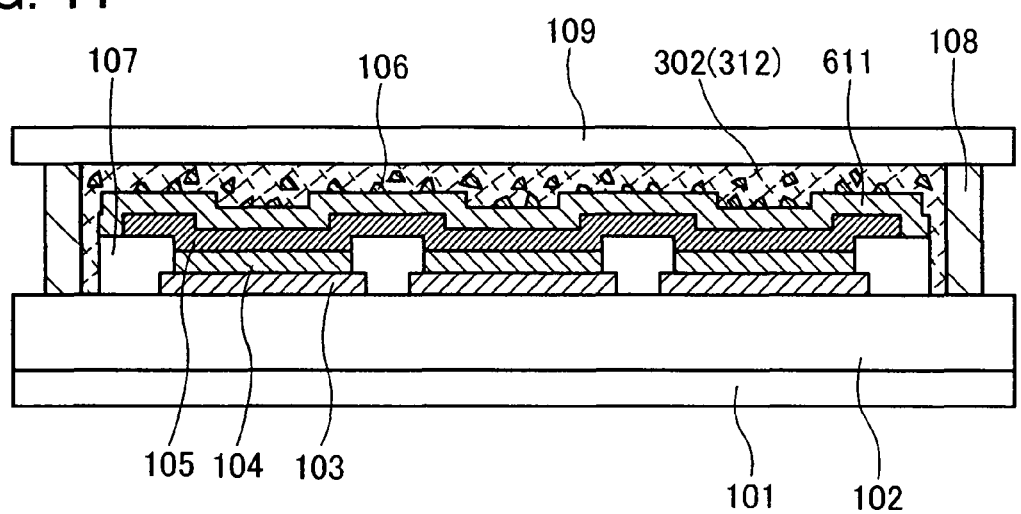
FIG. 11 is a cross sectional view of a light emitting device (Embodiment Mode 8)

Embodiment Mode 8 will be described with reference to FIGS. 9 to 11. This embodiment mode will describe a light emitting device including light emitting elements in which a protective film is provided over a second electrode.

By the process described in Embodiment Mode 1, a substrate 101 over which light emitting elements each including a first electrode 103, a light emitting layer 104, and a second electrode 105 are formed is prepared. Then, a protective film 611 is formed in contact with a surface of the second electrode 105. Then, fine particles 106 are provided over the protective film 611. To provide the fine particles 106, similarly to Embodiment Mode 1, the fine particles 106 may be sprayed by a dry method or a wet method.

A film having a high transmittance to visible light is used as the protective film 611. Specifically, silicon oxide ($SiO_y$, $0<y\leqq2$), silicon nitride ($SiN_x$, $0<x\leqq4/3$), silicon nitride oxide ($SiN_xO_y$, $0<x<4/3$, $0<y<2$, $0<3x+2y\leqq4$), DLC, aluminum nitride, or the like can be used. A formation method of the protective film 611 is selected from a vapor deposition method, a sputtering method, a plasma CVD method, a coating method of a material solution which is prepared by dissolving a material in a solvent, and the like, depending on the material of the protective film 611.

In order to prevent the total reflection at an interface between the second electrode 105 and the protective film 611, a material having a refractive index which is equal to or higher than that of the second electrode 105 is preferably selected as the material of the protective film 611. In the case of forming silicon oxide, silicon nitride, silicon nitride oxide, or the like by a plasma CVD method for example, adjustment of the refractive index of the protective film 611 can be performed by adjusting the relative permittivity of a stacked film, which is achieved by changing ratio of source gases, kind of source gases, or processing temperature.

For the fine particles 106, a material having a refractive index which is equal to or higher than that of the second electrode 105 is preferably selected in order to prevent total reflection at the interface between the second electrode 105 and the protective film 611.

Next, as described in Embodiment Modes 1, 2, and 5, the substrate 109 is firmly attached to the substrate 101. Note that sealing can also be performed with a sheet-like sealing material to which the fine particles 106 are attached, as described in Embodiment Mode 6. Light emitting devices on which the sealing processes of Embodiment Modes 1, 2, 5, and 6 are conducted are shown in FIGS. 10A to 10C. FIG. 10A corresponds to Embodiment Mode 1, FIG. 10B corresponds to Embodiment Mode 2, and FIG. 10C corresponds to Embodiment Modes 5 and 6.

Instead of spraying the fine particles 106, a method of dropwising an uncured filler in which fine particles are dispersed can be employed as shown in Embodiment Modes 3 and 4. A light emitting device fabricated using the method of Embodiment Modes 3 and 4 is illustrated in FIG. 11.

A light emitting element of this embodiment mode has improved extraction efficiency of light emitted from the light emitting element, which originates from a similar principle to that described in Embodiment Mode 1. In other words, since the shape of the surface of the protective film 611 is changed by providing a plurality of fine particles 106 on a surface of the protective film 611 on the light extraction side, light having an incident angle, which usually leads total reflection of the light at an interface between the second electrode 105 and the fine particles 106, is not totally reflected, and the light is refracted and scattered by the protective film 611, allowing the light to pass the fine particles 106. Thus, by providing the plurality of fine particles in contact with the surface of the protective film 611, the amount of light which is totally reflected at the interface between the second electrode 105 and the protective film 611 is reduced. Accordingly, light extraction efficiency is improved.

Embodiment Mode 9

Figure 12A:
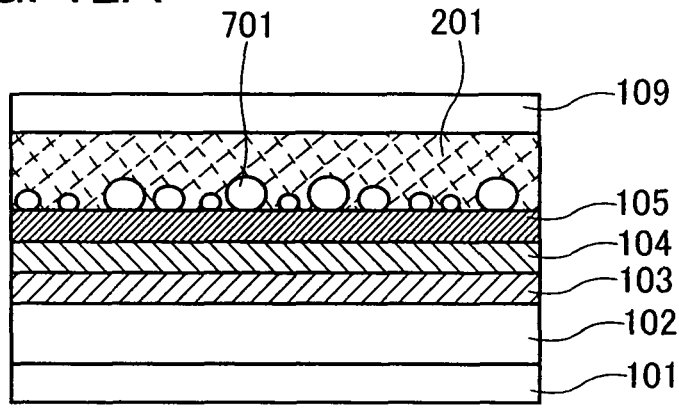
FIGS. 12A to 12C are cross sectional views of light emitting devices (Embodiment Mode 9)

Embodiment Mode 9 will be described with reference to FIGS. 12A to 12C. FIG. 1 shows an example where the fine particles 106 are polyhedral and have different shapes and sizes. Effects of lens and a prism become significant depending on the shape of the fine particles. For example, as shown in FIG. 12A, fine particles 701 are made to be spherical. By passing the spherical fine particles 701, the light which passes through the second electrode 105 can be concentrated. Note that in the case of solid sealing, the spherical fine particles 701 are fixed in a state that the fine particles 701 are pressed to the surface of the second electrode 105 by the pressure applied when firmly attaching the substrate 101 to the substrate 109.

Figure 12B:
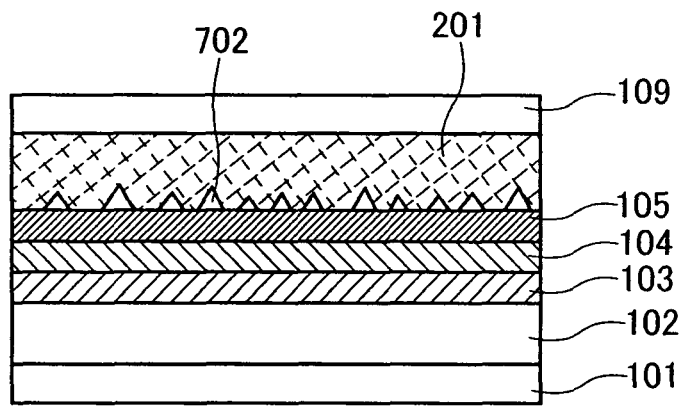

As shown in FIG. 12B, the shape of fine particles 702 are allowed to possess a triangular pyramid shape or a triangular pole shape, giving an effect of a prism to the fine particles 702. Light is scattered by passing the fine particles 702, and the viewing angle can be increased. Further, by passing the spherical fine particles 701, the light which passes through the second electrode 105 can be concentrated.

Figure 12C:
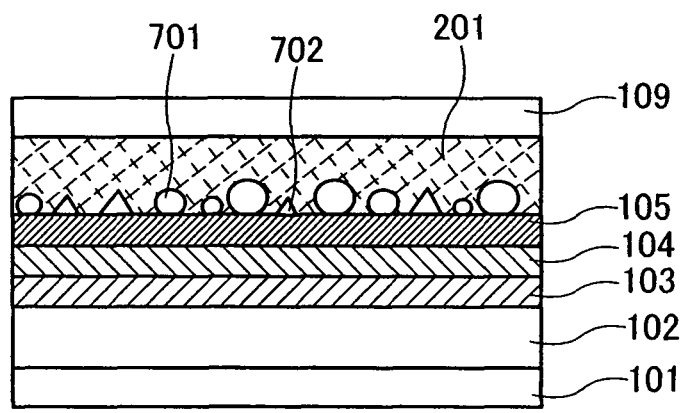

As shown in FIG. 12C, both the spherical fine particles 701 and the fine particles 702 having a triangular pyramid shape or a triangular pole shape may also be employed simultaneously.

Although the fine particles 701 and 702 have unequal sizes in FIGS. 12A to 12C, they may have the same size. Further, the structure shown in Embodiment Mode 2 is employed as an example of a structure of a light emitting device in FIGS. 12A to 12C, and any structure of other embodiment modes can be employed as well.

Embodiment Mode 10

Embodiment Mode 10 will be described with reference to FIGS. 13 to 16. In this embodiment mode, an example of using an active matrix EL panel having a display function as a light emitting device will be described.

Figure 13:
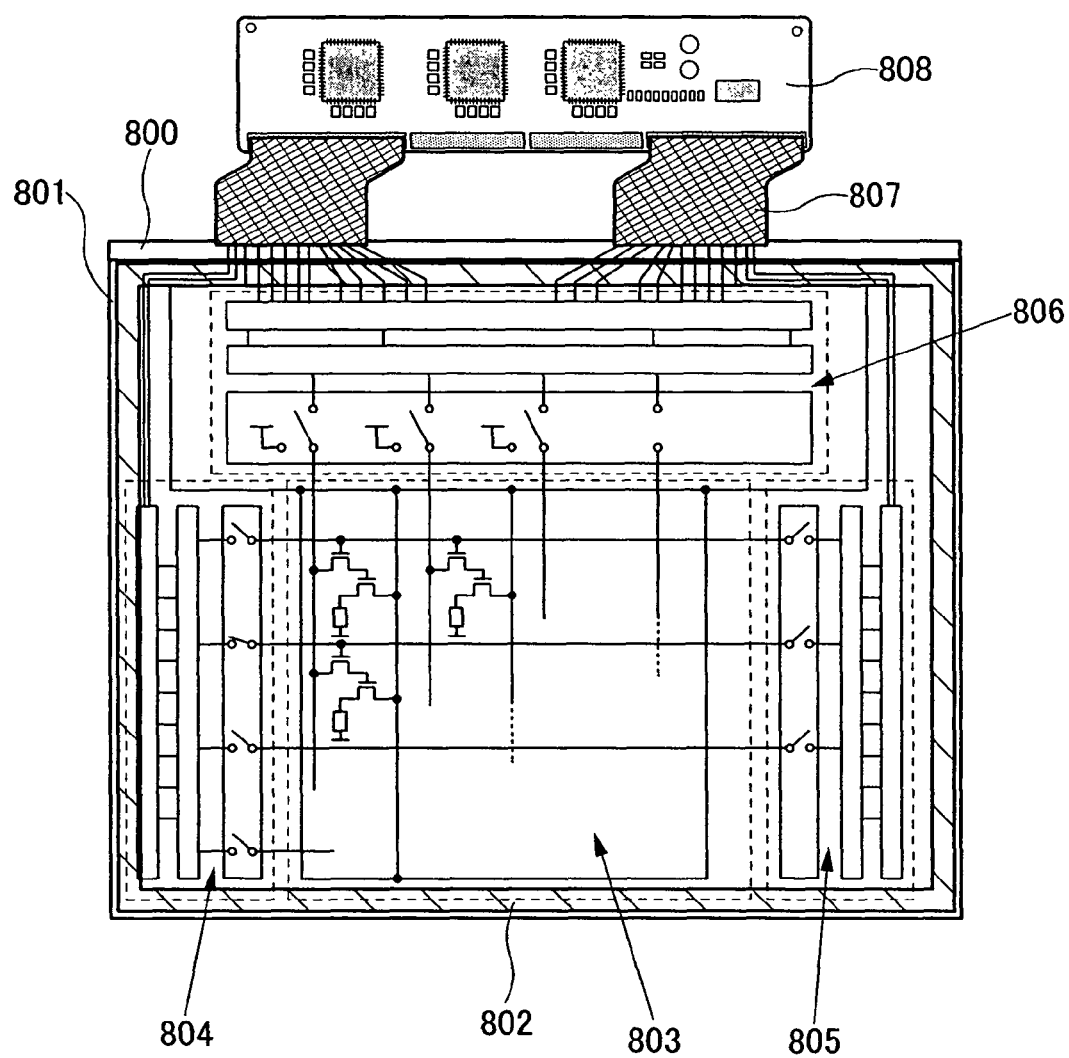
FIG. 13 is a top view of a light emitting device (Embodiment Mode 10)

FIG. 13 is an exemplary illustrations of an active matrix EL panel when seen from the top. A sealing substrate 801 is firmly fixed to a substrate 800 with a sealing material 802. A space between the substrate 800 and the sealing substrate 801 is air-sealed. Further, the sealing structure of the EL panel is a solid sealing structure in this embodiment mode, and this space is filled with a filler made of a resin.

Over the substrate 800, a pixel portion 803, a writing gate signal line driver circuit portion 804, an erasing gate signal line driver circuit portion 805, and a source signal line driver circuit portion 806 are provided. The driver circuit portions 804 to 806 are connected, via a wiring group, to an FPC (flexible printed circuit) 807 which is an external input terminal. The source signal line driver circuit portion 806, the writing gate signal line driver circuit portion 804, and the erasing gate signal line driver circuit portion 805 receive a video signal, a clock signal, a start signal, a reset signal, and the like from the FPC 807. In addition, a printed wiring board (PWB) 808 is attached to the FPC 807.

Transistors in the pixel portion 803 and the driver circuit portions 804 to 806 are constructed by thin film transistors (TFTs). Note that the driver circuit portions 804 to 806 need not necessarily be provided over the same substrate 800 as the pixel portion 803, unlike the example described above. For example, the driver circuit portions 804 to 806 may be provided outside the substrate by utilizing a TCP (tape carrier package) in which an IC chip is mounted on an FPC on which a wiring pattern is formed. A part of the driver circuit portions 804 to 806 may be provided over the substrate 800, and another part of them may be provided outside the substrate 800.

Figure 14:
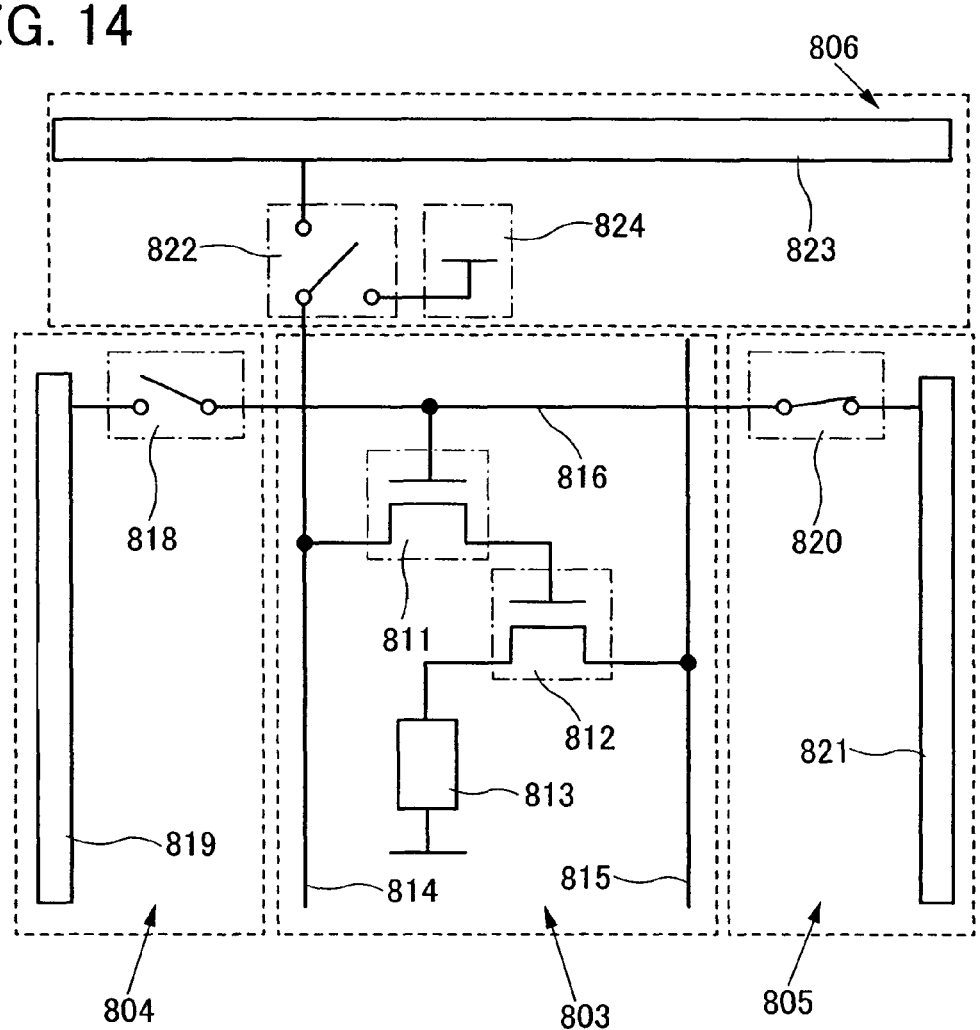
FIG. 14 shows circuits of a pixel in a light emitting device (Embodiment Mode 10)

FIG. 14 is a view of circuits for operating one pixel. A plurality of pixels is planarly arranged in the pixel portion 803. In one pixel, a first transistor 811, a second transistor 812, and a light emitting element 813 are included. Further, a source signal line 814 and a current supply line 815 which extend in columns and a gate signal line 816 which extends in a row are provided. The light emitting element 813 is an EL element having a top emission structure, and light is extracted from the substrate 801 side.

Each of the first transistor 811 and the second transistor 812 is a three-terminal element including a gate electrode, a drain region, and a source region, and a channel region is included between the source region and the drain region. Here, since a region serving as the source region and a region serving as the drain region are changed depending on a structure of a transistor, an operational condition, and the like, it is difficult to determine which region is the source region or the drain region. Therefore, in this specification, three terminals of the transistor are referred to as a gate electrode, a first electrode, and a second electrode for being distinguished.

In the writing gate signal line driver circuit portion 804, the gate signal line 816 is electrically connected to the writing gate signal line driver circuit 819 via a switch 818. By controlling the switch 818, whether the gate signal line 816 is electrically connected to the writing gate signal line driver circuit 819 or not is selected.

In the erasing gate signal line driver circuit portion 805, the gate signal line 816 is electrically connected to an erasing gate signal line driver circuit 821 via a switch 820. By controlling the switch 820, whether the gate signal line 816 is electrically connected to the erasing gate signal line driver circuit 821 or not is selected.

In the source signal line driver circuit portion 806, the source signal line 814 is electrically connected to either a source signal line driver circuit 823 or a power source 824 by a switch 822.

The first transistor 811 includes the gate electrode electrically connected to the gate signal line 816, the first electrode electrically connected to the source signal line 814, and the second electrode electrically connected to the gate electrode of the second transistor 812.

The second transistor 812 includes the gate electrode electrically connected to the second electrode of the first transistor as described above, the first electrode electrically connected to the current supply line 815, and the second electrode electrically connected to a first electrode of the light emitting element 813. A second electrode of the light emitting element 813 has a constant potential.

The structure of a pixel of this embodiment mode will be described with reference to FIG. 15. Since this embodiment mode shows the case of the EL panel having a solid sealing structure, the air-sealed space between the substrate 800 and the sealing substrate 801 is filled with a filler 830 made of a resin. Over the substrate 800, a support 831 and the light emitting element 813 are formed. As the support 831, the first transistor 811 and the second transistor 812 shown in FIG. 14 are formed over a base film 832. An interlayer insulating film 833 is formed over the first transistor 811 and the second transistor 812. The light emitting element 813 and an insulating layer 834 serving as a partition wall are formed over the interlayer insulating film 833.

Each of the first transistor 811 and the second transistor 812 is a top-gate thin film transistor in which a gate electrode is provided on the side opposite to the substrate with a semiconductor layer, where a channel formation region is formed, as a center. The structure of the thin film transistors of the first transistor 811 and the second transistor 812 is not particularly limited, and for example, a bottom-gate type may be used. In the case of the bottom-gate type, a protective film may be formed over a semiconductor layer where a channel is formed (channel protective type); alternatively, a part of a semiconductor layer where a channel is formed may have a concave shape (channel etch type).

Further, the semiconductor layer where the channel formation region is formed, of the first transistor 811 and the second transistor 812 may be formed of either a crystalline semiconductor or an amorphous semiconductor.

As specific examples of the crystalline semiconductor when the semiconductor layer is formed of a crystalline semiconductor, materials which contain single crystalline or polycrystalline silicon, germanium silicon, or the like can be used. These materials may be formed by laser crystallization or a crystallization by a solid-phase growth method using, for example, nickel or the like.

In the case where the semiconductor layer is formed of an amorphous semiconductor, for example, amorphous silicon, it is preferable that all thin film transistors forming the pixel portion 803 are n-channel type. In other cases, either or both of an n-channel transistor and a p-channel transistor may be formed in the pixel portion 803.

The same as the first transistor 811 and the second transistor 812 of the pixel portion 803 can be applied to transistors used in the driver circuit portions 804 to 806. In accordance with the performance of transistors, it is selected whether all the driver circuit portions 804 to 806 are formed of thin film transistors or whether a part of the driver circuit portions is formed of thin film transistors and the other is formed of an IC chip. The transistors of the driver circuit portions 804 to 806 may be either or both of an n-channel type and a p-channel type.

Figure 15:
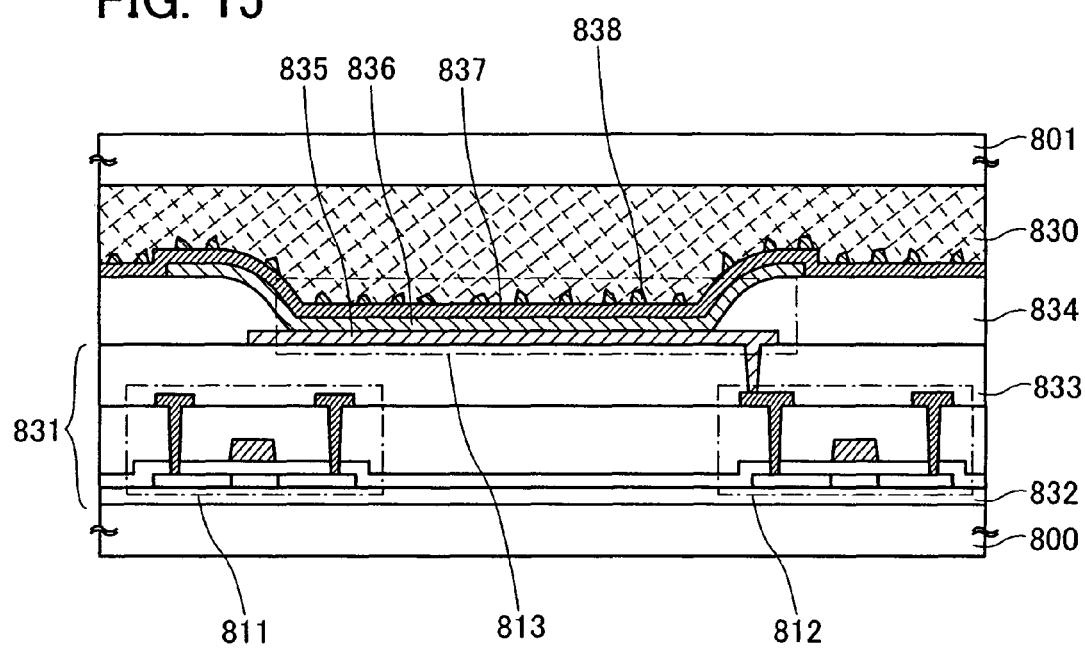
FIG. 15 is a cross sectional view of a pixel in a light emitting device (Embodiment Mode 10)

In FIG. 15, the light emitting element 813 includes a light emitting layer 837 between a first electrode 835 and a second electrode 836. Over the interlayer insulating film 833, the first electrode 835, the light emitting layer 837, and the second electrode 836 are sequentially stacked. The first electrode 835 is a reflective electrode and serves as a cathode. The second electrode 836 is a light-transmitting electrode and serves as an anode. Light emitted from the light emitting layer 837 is extracted from the second electrode 836.

The first electrode 835 is connected to the second electrode of the transistor 812 by a contact hole provided in the interlayer insulating film 833.

A plurality of fine particles 838 is provided in contact with a surface of the second electrode 836. By this fine particles, the amount of total reflection of light which enters an interface between the second electrode 836 and the filler 830 is reduced. Accordingly, light extraction efficiency of the light emitting element 813 can be improved.

The solid sealing structure described in Embodiment Mode 2 is employed as a sealing structure of the EL panel in this embodiment mode; however, any sealing structure of other embodiment modes can be employed obviously.

Figure 16:
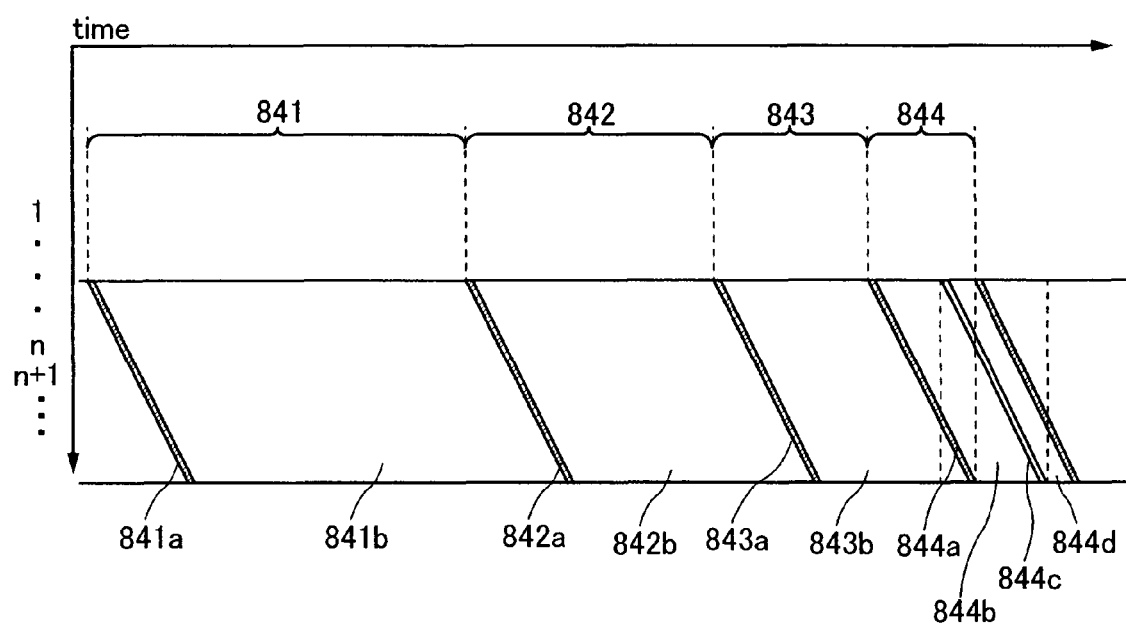
FIG. 16 shows a driving method of a light emitting device (Embodiment Mode 10)

A driving method of an EL panel of this embodiment mode will be described with reference to FIG. 16. FIG. 16 shows operation of a frame in accordance with the passage of time. In FIG. 16, the horizontal direction indicates the passage of time, while the vertical direction indicates the number of scanning stages of a gate signal line.

When an image is displayed with an EL panel of this embodiment mode, rewriting operations and displaying operations of a screen are carried out repeatedly in the display period. There is no particular limitation on the number of rewriting operations; however, the rewriting operations are preferably performed about 60 times or more in a second so that a person who watches a displayed image does not sense a flicker in the image. Here, a period of the rewriting and displaying operations for one screen (one frame) is referred to as one frame period.

One frame period is time-divided into four sub-frames 841, 842, 843, and 844 including address periods 841a, 842a, 843a, and 844a and sustain periods 841b, 842b, 843b, and 844b, respectively. The light emitting element to which a signal for light emission is applied is in a light emitting state during the sustain periods. The length ratio of the sustain periods of the sub-frames, the first sub-frame 841: the second sub-frame 842: the third sub-frame 843: the fourth sub-frame 844, satisfies $2^3:2^2:2^1:2^0=8:4:2:1$. This allows the light emitting element to display a 4-bit gray scale. The number of bits and the gray scales are not limited to those shown in this embodiment mode. For example, one frame period may include eight sub-frames so as to display a 8-bit gray scale.

The operation of one frame period will be described. First, in the sub-frame 841, the writing operation is performed sequentially from a first row to a last row. Therefore, the starting time of the writing period varies depending on the row. The sustain period 841b sequentially starts in the rows in which the address period 841a has been terminated. In the sustain period 841b, the light emitting element applied with a signal for light emission remains in a light emitting state. The sub-frame 841 is changed to the next sub-frame 842 sequentially in the rows in which the sustain period 841b has been terminated. In the sub-frame 842, a writing operation is performed sequentially from the first row to the last row, in the same manner as in the case of the sub-frame 841.

The above-mentioned operations are carried out repeatedly up to the sustain period 844b of the sub-frame 844, and are then terminated. After terminating the operation of the sub-frame 844, an operation in the next frame is started. Accordingly, the sum of the light-emitting time in all the sub-frames corresponds to the light emitting time of each light emitting element in one frame period. By varying the light emitting time for each light emitting element and combining the light emitting elements in various ways within one pixel, various display colors with differing brightness and differing chromaticity can be formed.

When a sustain period is intended to be forcibly terminated in the row in which the writing operation has already been terminated and the sustain period has started, prior to terminating the writing operation up to the last row as in the sub-frame 844, an erasing period 844c is preferably provided after the sustain period 844b so as to stop light emission forcibly. The row where light emission is forcibly stopped does not emit light for a certain period (this period is referred to as a non-light emitting period 844d). Right after terminating the address period in the last row, an address period of a next sub-frame (or a next frame) starts sequentially from the first row. This can prevent the address period in the sub-frame 844 from overlapping with the address period in the next sub-frame.

Although the sub-frames 841 to 844 are arranged in order from the longest to the shortest length of the sustain period in this embodiment mode, they do not necessarily have to be arranged in this order. For example, the sub-frames may be arranged in order from the shortest length of the sustain period to the longest. Alternatively, the sub-frames may be arranged in random order regardless of the length of the sustain period. In addition, these sub-frames may further be divided into a plurality of frames. In other words, scanning of gate signal lines may be performed a plurality of times during a period of supplying the same video signal.

The operations in the address period and the erasing period of the circuit shown in FIG. 14 will be described. First, the operation in the address period is described. In the address period, the gate signal line 816 in the n-th row (n is a natural number) is electrically connected to the writing gate signal line driver circuit 819 via the switch 818, and is not connected to the erasing gate signal line driver circuit 821 by the switch 820.

The source signal line 814 is electrically connected to the source signal line driver circuit 823 via the switch 822. In this case, a signal is input to the gate of the first transistor 811 connected to the gate signal line 816 in the n-th row (n is a natural number), thereby turning the first transistor 811 on. At this time, video signals are simultaneously input to the source signal lines 814 in the first to the last columns. Further, the video signals input from each source signal line 814 are independent in columns from one another.

The video signal input from the source signal line 814 is input to the gate electrode of the second transistor 812 via the first transistor 811 connected to each source signal line 814. At this time, it is determined whether the light emitting element 813 emits light or not depending on the current value of the signal that is input to the second transistor 812. For instance, when the second transistor 812 is a p-channel type, the light emitting element 813 emits light by inputting a low level signal to the gate electrode of the second transistor 812. On the other hand, when the second transistor 812 is an n-channel type, the light emitting element 813 emits light by inputting a high level signal to the gate electrode of the second transistor 812.

Next, the operation in the erasing period will be described. In the erasing period, the gate signal line 816 in the n-th row (n is a natural number) is electrically connected to the erasing gate signal line driver circuit 821 via the switch 820, and is not connected to the writing gate signal line driver circuit 821 by the switch 818. The source signal line 814 is electrically connected to the power source 824 via the switch 822. In this case, by inputting a signal to the gate of the first transistor 811 connected to the gate signal line 816 in the n-th row, the first transistor 811 is turned on. At this time, erasing signals are simultaneously input to the source signal lines 814 in the first to the last columns.

The erasing signal input from the source signal line 814 is input to the gate electrode of the second transistor 812 via the first transistor 811 connected to the source signal line 814. Then, the supply of a current flowing from the power supply line 815 to the light emitting element 813 is stopped by the signal input to the second transistor 812. This forcibly makes the light emitting element 813 emit no light. For example, when the second transistor 812 is a p-channel type, the light emitting element 813 emits no light by inputting a high level signal to the gate electrode of the second transistor 812. On the other hand, when the second transistor 812 is an n-channel type, the light emitting element 813 emits no light by inputting a low level signal to the gate electrode of the second transistor 812.

In the erasing period, a signal for erasing is input to the n-th row (n is a natural number) by the above-mentioned operation. However, as mentioned above, the n-th row sometimes remains in the erasing period while another row (referred to as an m-th row (m is a natural number)) is in the writing period. In this case, since a signal for erasing is necessary to be input to the n-th row and a signal for writing is necessary to be input to the m-th row by utilizing the source signal line 814 in the same column, the operation mentioned below is preferably carried out.

Right after the light emitting element 813 in the n-th row stops emitting light by the above-described operation in the erasing period, the gate signal line 816 and the erasing gate signal line driver circuit 821 are disconnected from each other, while the source signal line 814 is connected to the source signal line driver circuit 823 by switching the switch 822. Then, the gate signal line 816 and the writing gate signal line driver circuit 819 are connected to each other by the switch 818. Then, a signal is selectively input to the gate signal line 816 in the m-th row from the writing gate signal line driver circuit 819, and the first transistor 811 is turned on. Meanwhile, signals for writing are input to the source signal lines 814 in the first to the last columns from the source signal line driver circuit 823. The light emitting element in the m-th row emits light or no light depending on the signal.

After terminating the address period in the m-th row as mentioned above, the erasing period immediately starts in the (n+1)-th row. Therefore, the gate signal line 816 and the writing gate signal line driver circuit 819 are disconnected from each other by the switch 818, and the gate signal line 816 is connected to the erasing gate signal line driver circuit 821 by switching the switch 820. In addition, the source signal line 814 is connected to the power source 824 by switching the switch 822. Then, a signal is input to the gate signal line 816 in the (n+1)-th row from the erasing gate signal line driver circuit 821 to turn on the first transistor 811, while an erasing signal is input from the power source 824. Similarly, an erasing period and an address period are repeated alternately up to the erasing period of the last row.

Embodiment Mode 11

Reduction of the power consumption of the light emitting devices described in Embodiment Modes 1 to 8 can be realized by improving light extraction efficiency of the light emitting element. Accordingly, by mounting these light emitting devices as a display portion, vivid and bright display with low power consumption can be performed.

Therefore, the light emitting devices of Embodiment Modes 1 to 9 can be favorably used for a display portion of a battery-powered electronic device, a display device with a large-sized screen, or a display portion of an electronic device. The following can be given as examples: a television device (a TV or a television receiver), a camera such as a digital camera or a digital video camera, a cellular phone device (a cellular phone handset), a portable information terminal such as PDA, a portable game machine, a monitor, a computer, an audio reproducing device such as a car audio, an image reproducing device provided with a recording medium such as a home game machine, and the like. Specific examples thereof will be described with reference to FIGS. 17A to 17F. A light emitting device used in a display portion may have either an active matrix type or a passive type.

Figure 17A:
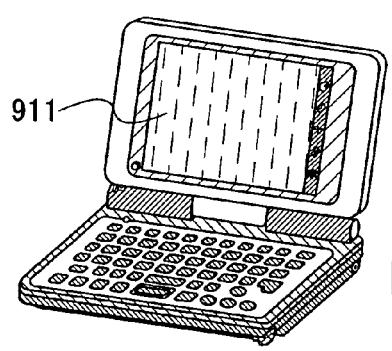
FIGS. 17A to 17F show modes of electronic devices to which a light emitting device is applied (Embodiment Mode 11)

A light emitting device is used in a display portion 911 of a portable information terminal device shown in FIG. 17A.

Figure 17B:
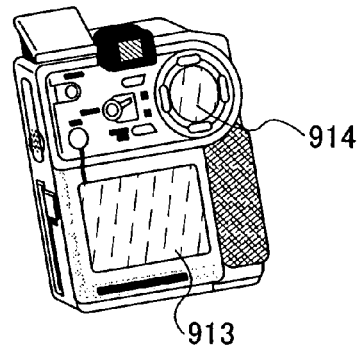

A light emitting device is used in a finder 914 and a display portion 913 for displaying a taken image in a digital video camera shown in FIG. 17B.

Figure 17C:
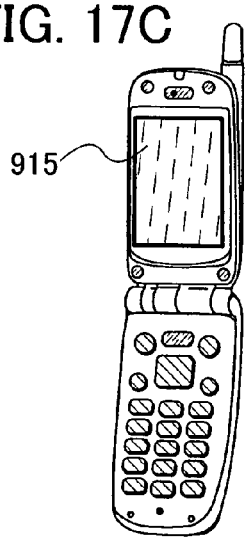

A light emitting device can be applied to a display portion 915 of a cellular phone handset shown in FIG. 17C.

Figure 17D:
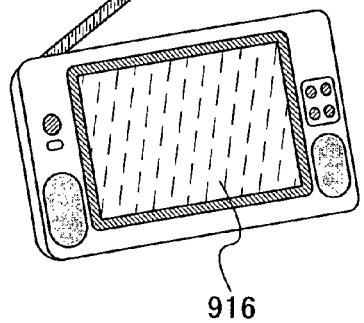

The light emitting device of the above-described embodiment mode is used in a display portion 916 of a portable television device shown in FIG. 17D.

Figure 17E:
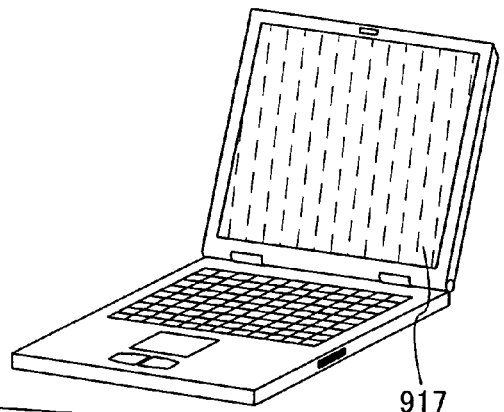

The light emitting device of the above-described embodiment mode can be applied to a display portion 917 of a notebook or laptop computer shown in FIG. 17E.

Figure 17F:
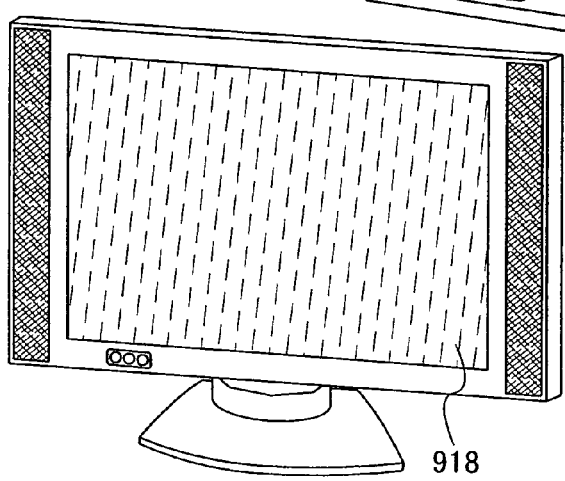

The light emitting device of the present invention can be applied to a display portion 918 of a television device shown in FIG. 17F. Note that the light emitting device of the above-described embodiment mode can be applied to display portions of television devices with various screen sizes including a small television device mounted on a portable terminal such as the cellular phone handset shown in FIG. 17D, a medium television device which is portable, and a large (for example, 40-inch or larger) television device.

Embodiment Mode 12

Embodiment Mode 12 will describe a mode where a light emitting device is applied to a planar lighting device. The light emitting devices of Embodiment Modes 1 to 9 can be used in a planar lighting device as well as in a display portion. For example, in the case of using a liquid crystal panel in a display portion of an electronic device exemplified in the above-described embodiment mode, the light emitting device of the above-described embodiment mode can be mounted as a backlight of the liquid crystal panel. In the case of using the light emitting device as a lighting device, a passive light emitting device is preferably used.

Figure 18:
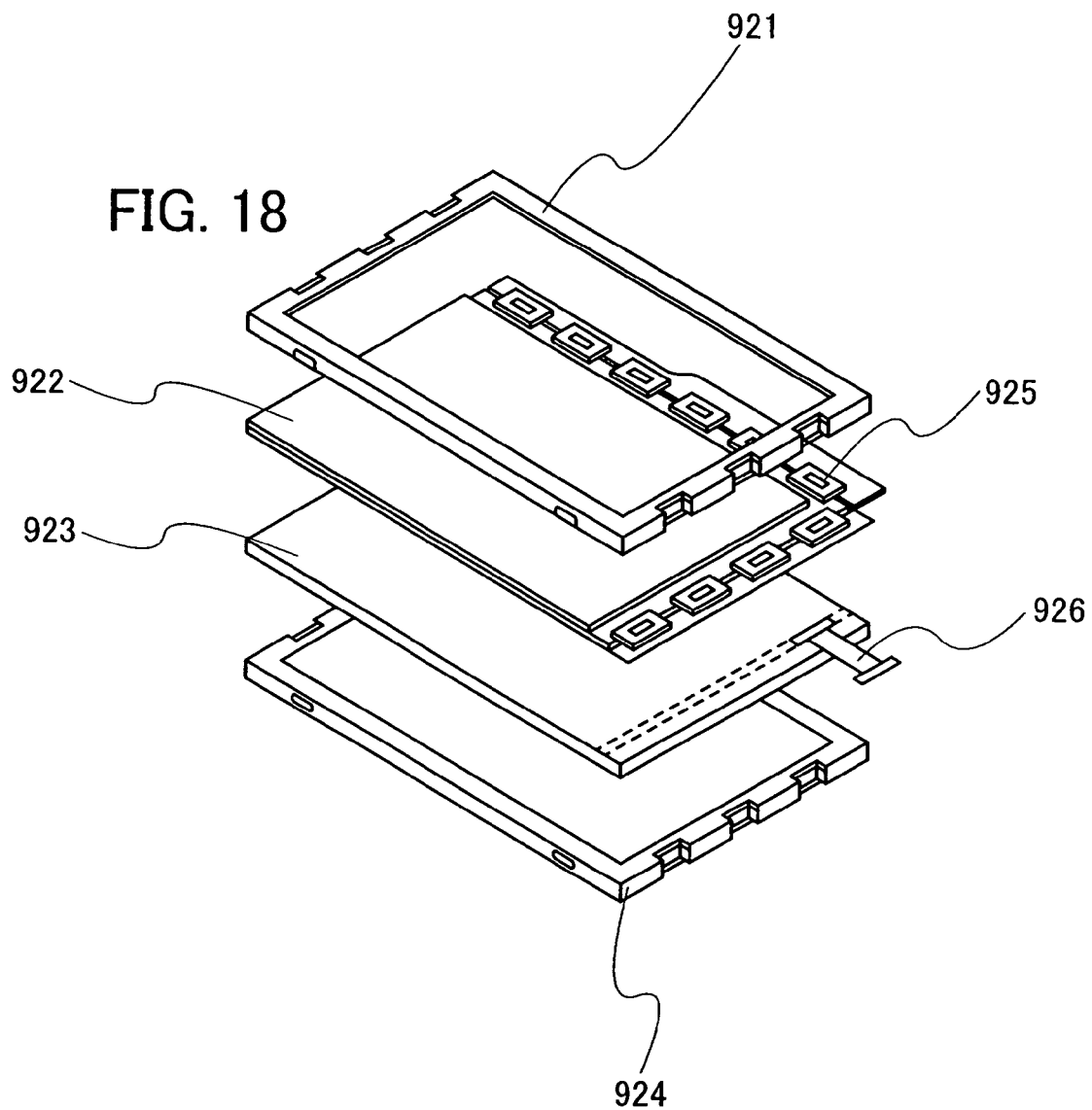
FIG. 18 shows a mode of a flat lighting device to which a light emitting device is applied (Embodiment Mode 12).

FIG. 18 shows an example of a liquid crystal display device using the light emitting device as a backlight. The liquid crystal display device shown in FIG. 18 includes a housing 921, a liquid crystal layer 922, a backlight 923, and a housing 924, and the liquid crystal layer 922 is connected to a driver IC 925. The light emitting device of the present invention is used for the backlight 923, and current is supplied through a terminal 926.

A liquid crystal display device including the backlight of this embodiment mode can be used for display portions of various electronic devices as described in Embodiment Mode 11.

By using the light emitting device to which the present invention is applied as the backlight of the liquid crystal display device, a backlight with brightness and reduced power consumption can be obtained. The light emitting device to which the present invention is applied is a lighting device with plane emission, and can have a large area. Therefore, the backlight can have a large area, and the liquid crystal display device can have a large area, too. Furthermore, the light emitting device has a thin shape and consumes low power; therefore, a thinner shape and lower power consumption of a display device can also be achieved.

This application is based on Japanese Patent Application serial no. 2006-057154 filed in Japan Patent Office on Mar. 3, 2006, the entire contents of which are hereby incorporated by reference.

What is claimed is:

1. A light emitting device comprising:
a first substrate;
a support over the first substrate;
a first electrode and a light emitting layer which are sequentially stacked over the support;
a partition wall formed over and in contact with the support, the partition wall covering an edge of the first electrode and dividing each of the first electrode and the light emitting layer into at least two regions;
a second electrode over the light emitting layer and the partition wall; and
a plurality of fine particles which are formed on the second electrode so as to be in contact with an upper surface of the second electrode,
wherein a material of the second electrode is same as a material of the plurality of fine particles, and
wherein the material is selected from zinc oxide, indium oxide, and tin oxide.

2. The light emitting device according to claim 1, wherein the fine particles are sprayed on the upper surface of the second electrode by a dry method.

3. The light emitting device according to claim 1, wherein the fine particles are sprayed on the upper surface of the second electrode by a wet method.

4. The light emitting device according to claim 1, wherein the plurality of fine particles have a refractive index which is equal to or higher than a refractive index of the second electrode.

5. The light emitting device according to claim 1, further comprising a second substrate opposed to the first substrate with at least the first electrode, the light emitting layer, the second electrode and the plurality of fine particles interposed therebetween,
wherein a sealing material is interposed between the plurality of fine particles and the second substrate, and
wherein the sealing material is in contact with the plurality of fine particles and the second substrate.

6. The light emitting device according to claim 1, wherein at least one of the fine particles has a diameter in a region between 2 nm and 800 nm.

7. The light emitting device according to claim 6, wherein at least one of the fine particles has the diameter in a region between 20 nm and 100 nm.

8. The light emitting device according to claim 1, wherein a shape of the fine particles is selected from a columnar shape, a polyhedral shape, a polypyramidal shape such as a triangular pyramid, a circular cone shape, a concave lens shape, a convex lens shape, a log-backed shape, a prism shape, a spherical shape or a semispherical shape.

9. The light emitting device according to claim 1, wherein both a spherical fine particles and fine particles having a triangular pyramid shape or a triangular pole shape are employed simultaneously.

10. The light emitting device according to claim 1, further comprising a second substrate opposed to the first substrate,
wherein a sealing material is interposed between the plurality of fine particles and the second substrate, and
wherein the sealing material is in contact with the plurality of fine particles and the second substrate.

11. The light emitting device according to claim 1, wherein the plurality of fine particles is in contact with an upper surface of the partition wall.

12. The light emitting device according to claim 1, wherein the second electrode is a multilayer film.

13. The light emitting device according to claim 12, wherein the multilayer film is formed by a stack of a metal and a transparent conductive film, and
wherein a thickness of the metal is 1 to 50 nm.

14. A light emitting device comprising:
a first substrate;
a support over the first substrate
a first electrode and a light emitting layer which are sequentially stacked over the support;
a partition wall formed over and in contact with the support, the partition wall covering an edge of the first electrode and dividing each of the first electrode and the light emitting layer into at least two regions;
a second electrode over the light emitting layer and the partition wall;
a film formed over and in contact with the second electrode; and
a plurality of fine particles which are formed on the film so as to be in contact with an upper surface of the film,
wherein the plurality of fine particles have a refractive index which is equal to or higher than a refractive index of the film,
wherein the film has a refractive index which is equal to or higher than a refractive index of the second electrode, wherein a material of the second electrode is same as a material of the plurality of fine particles, and wherein the material is selected from zinc oxide, indium oxide, and tin oxide.

15. The light emitting device according to claim 14, wherein the fine particles are sprayed on the film by a dry method.

16. The light emitting device according to claim 14, wherein the fine particles are sprayed on the film by a wet method.

17. The light emitting device according to claim 14, wherein the film is a protective film.

18. The light emitting device according to claim 14, further comprising a second substrate opposed to the first substrate with at least the first electrode, the light emitting layer, the second electrode, the film and the plurality of fine particles interposed therebetween, wherein a sealing material is interposed between the plurality of fine particles and the second substrate, and wherein the sealing material is in contact with the plurality of fine particles and the second substrate.

19. The light emitting device according to claim 14, wherein at least one of the fine particles has a diameter in a region between 2 nm and 800 nm.

20. The light emitting device according to claim 7, wherein at least one of the fine particles has the diameter in a region between 20 nm and 100 nm.

21. The light emitting device according to claim 14, wherein a shape of the fine particles is selected from a columnar shape, a polyhedral shape, a polypyramidal shape such as a triangular pyramid, a circular cone shape, a concave lens shape, a convex lens shape, a hog-backed shape, a prism shape, a spherical shape, or a semispherical shape.

22. The light emitting device according to claim 14, wherein both a spherical fine particles and fine particles having a triangular pyramid shape or a triangular pole shape are employed simultaneously.

23. The light emitting device according to claim 14, wherein the film is in contact with un upper surface of the partition wall.

24. The light emitting device according to claim 14, wherein the second electrode is a multilayer film.

25. The light emitting device according to claim 24,
wherein the multilayer film is formed by a stack of a metal and a transparent conductive film, and
wherein a thickness of the metal is 1 to 50 nm.

26. A light emitting device comprising:
a first substrate;
a support over the first substrate;
a first electrode and a light emitting layer which are sequentially stacked over the support;
a partition wall formed over and in contact with the support, the partition wall covering an edge of the first electrode and dividing each of the first electrode and the light emitting layer into at least two regions;
a second electrode over the light emitting layer and the partition wall;

a plurality of fine particles which are formed on the second electrode so as to be in contact with an upper surface of the second electrode; and a film which covers the upper surface of the second electrode and the plurality of fine particles, wherein the film has a refractive index which is equal to or higher than a refractive index of the second electrode, wherein a material of the second electrode is same as a material of the plurality of fine particles, and wherein the material is selected from zinc oxide, indium oxide, and tin oxide.

27. The light emitting device according to claim 26, wherein the fine particles are sprayed on the upper surface of the second electrode by a dry method.

28. The light emitting device according to claim 26, wherein the fine particles are splayed on the upper surface of the second electrode by a wet method.

29. The light emitting device according to claim 26, wherein the plurality of fine particles have a refractive index which is equal to or higher than the refractive index of the second electrode.

30. The light emitting device according to claim 26, wherein the film is a protective film.

31. The light emitting device according to claim 26, further comprising a second substrate opposed to the first substrate with at least the first electrode, the light emitting layer, the second electrode, the plurality of fine particles and the film interposed therebetween, wherein a sealing material is interposed between the film and the second substrate, and wherein the sealing material is in contact with the film and the second substrate.

32. The light emitting device according to claim 26, wherein at least one of the fine particles has a diameter in a region between 2 nm and 800 nm.

33. The light emitting device according to claim 32, wherein at least one of the fine particles has the diameter in a region between 20 nm and 100 nm.

34. The light emitting device according to claim 26, wherein a shape of the fine particles is selected from a columnar shape, a polyhedral shape, a polypyramidal shape such as a triangular pyramid, a circular cone shape, a concave lens shape, a convex lens shape, a hog-backed shape, a prism shape, a spherical shape, or a semispherical shape.

35. The light emitting device according to claim 26, wherein both a spherical fine particles and fine particles having a triangular pyramid shape or a triangular pole shape are employed simultaneously.

36. The light emitting device according to claim 26, wherein the plurality of fine particles are interposed between the second electrode and the film consisting of a transparent conductive film or an insulating film.

37. The light emitting device according to claim 26, wherein the second electrode is a multilayer film.

38. The light emitting device according to claim 37,
wherein the multilayer film is formed by a stack of a metal and a transparent conductive film, and
wherein a thickness of the metal is 1 to 50 nm.

* * * * *

UNITED STATES PATENT AND TRADEMARK OFFICE
CERTIFICATE OF CORRECTION

PATENT NO. : 8,492,972 B2
APPLICATION NO. : 11/711217
DATED : July 23, 2013
INVENTOR(S) : Yoshiharu Hirakata Page 1 of 1

It is certified that error appears in the above-identified patent and that said Letters Patent is hereby corrected as shown below:

In the Claims:

Column 23, line 25, Claim 20; Change "according to claim 7, wherein" to --according to claim 19, wherein--.

Signed and Sealed this
Fifth Day of November, 2013

Teresa Stanek Rea
*Deputy Director of the United States Patent and Trademark Office*

UNITED STATES PATENT AND TRADEMARK OFFICE
CERTIFICATE OF CORRECTION

PATENT NO. : 8,492,972 B2  
APPLICATION NO. : 11/711217  
DATED : July 23, 2013  
INVENTOR(S) : Yoshiharu Hirakata Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 814 days.

Signed and Sealed this
Twenty-seventh Day of January, 2015

Michelle K. Lee
*Deputy Director of the United States Patent and Trademark Office*